(12) United States Patent
Poltorak

(10) Patent No.: US 12,345,479 B2
(45) Date of Patent: Jul. 1, 2025

(54) FRACTAL HEAT TRANSFER DEVICE

(71) Applicant: Fractal Heatsink Technologies LLC, Miami, FL (US)

(72) Inventor: Alexander I Poltorak, Monsey, NY (US)

(73) Assignee: Fractal Heatsink Technologies LLC, Miami, FL (US)

( * ) Notice: Subject to any disclaimer, the term of this patent is extended or adjusted under 35 U.S.C. 154(b) by 357 days.

(21) Appl. No.: 17/562,718

(22) Filed: Dec. 27, 2021

(65) Prior Publication Data

US 2022/0120517 A1 Apr. 21, 2022

Related U.S. Application Data

(63) Continuation of application No. 16/056,481, filed on Aug. 6, 2018, now Pat. No. 11,209,220, which is a continuation-in-part of application No. 14/984,756, filed on Dec. 30, 2015, now Pat. No. 10,041,745, which is a continuation-in-part of application No. 14/817,962, filed on Aug. 4, 2015, now Pat. No. 10,527,368, which is a continuation of application (Continued)

(51) Int. Cl.
*F28F 1/40* (2006.01)
*F28F 21/02* (2006.01)
*H01L 23/36* (2006.01)
*H01L 23/367* (2006.01)
*F28D 21/00* (2006.01)

(52) U.S. Cl.
CPC ............... *F28F 1/40* (2013.01); *F28F 21/02* (2013.01); *H01L 23/36* (2013.01); *H01L 23/367* (2013.01); *F28D 2021/0029* (2013.01); *F28F 2215/10* (2013.01); *F28F 2255/20* (2013.01)

(58) Field of Classification Search
CPC .......... F28F 1/40; F28F 21/02; F28F 2215/10; F28F 2255/20; F28F 13/02; F28F 13/06; F28F 13/12; F28F 2260/00; F28F 9/0234; F28F 2210/02; H01L 23/36; F28D 2021/0029; H05K 7/20509
See application file for complete search history.

(56) References Cited

U.S. PATENT DOCUMENTS 5,760,333 A * 6/1998 Kitahara ................. F28F 3/022
174/16.3
6,015,008 A * 1/2000 Kogure ............... H01L 23/3672
257/722
(Continued)

FOREIGN PATENT DOCUMENTS

WO WO-2009124939 A1 * 10/2009 ............ B01F 5/0601

*Primary Examiner* — Travis Ruby
(74) *Attorney, Agent, or Firm* — Hoffberg & Associates; Steven M. Hoffberg

(57) ABSTRACT

A heatsink comprising a heat exchange device having a plurality of heat exchange elements each having a surface boundary with respect to a heat transfer fluid, having successive elements or regions varying according to a fractal relationship. According to one embodiment, a noise spectrum due to fluid flow is wideband. According to another embodiment, surface boundary layers are disrupted to increase heat transfer. Flow-induced vortices may be generated at non-corresponding locations of the plurality of fractally varying heat exchange elements.

18 Claims, 13 Drawing Sheets

Related U.S. Application Data

No. 13/106,640, filed on May 12, 2011, now Pat. No. 9,228,785.

(60) Provisional application No. 61/331,103, filed on May 4, 2010.

(56) References Cited

U.S. PATENT DOCUMENTS

| | | | | |
|---|---|---|---|---|
| 6,937,473 | B2* | 8/2005 | Cheng | F28F 3/02 257/722 |
| 7,256,751 | B2* | 8/2007 | Cohen | H01Q 1/36 343/792.5 |
| 7,411,791 | B2* | 8/2008 | Chang | H01L 23/427 165/185 |
| 2002/0080563 | A1* | 6/2002 | Pence | B01F 25/41 361/677 |
| 2003/0155110 | A1* | 8/2003 | Joshi | F28F 3/027 174/16.3 |
| 2006/0113065 | A1* | 6/2006 | Wolford | F28F 1/16 257/E23.088 |
| 2007/0067058 | A1* | 3/2007 | Miyamoto | B33Y 80/00 700/120 |
| 2007/0236406 | A1* | 10/2007 | Wen | H01Q 1/40 343/909 |
| 2008/0149304 | A1* | 6/2008 | Slaughter | B22F 12/17 430/269 |
| 2009/0045191 | A1* | 2/2009 | Ben-Shmuel | H05B 6/666 219/746 |
| 2009/0050293 | A1* | 2/2009 | Kuo | H01L 23/367 165/80.3 |
| 2009/0071624 | A1* | 3/2009 | Zhang | F21V 29/77 165/80.3 |
| 2009/0274549 | A1* | 11/2009 | Mitchell | F01D 5/186 415/115 |
| 2009/0321045 | A1* | 12/2009 | Hernon | B22D 25/02 165/80.2 |
| 2011/0080802 | A1* | 4/2011 | Vassilicos | B01F 25/41 366/337 |
| 2012/0285660 | A1* | 11/2012 | Poltorak | H05K 7/20509 165/104.11 |
| 2015/0328601 | A1* | 11/2015 | Vassilicos | F15D 1/025 366/336 |
| 2016/0320149 | A1* | 11/2016 | Poltorak | F28D 15/00 |

* cited by examiner

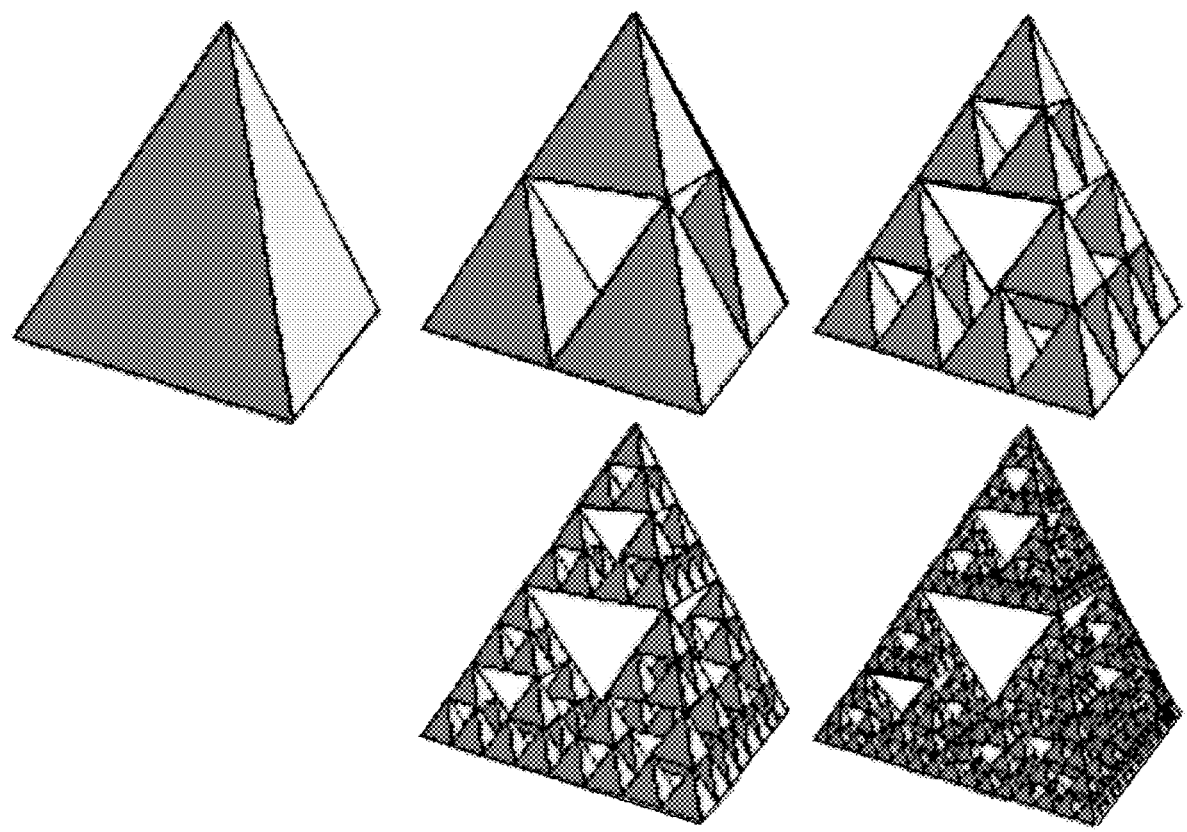
Fig. 10
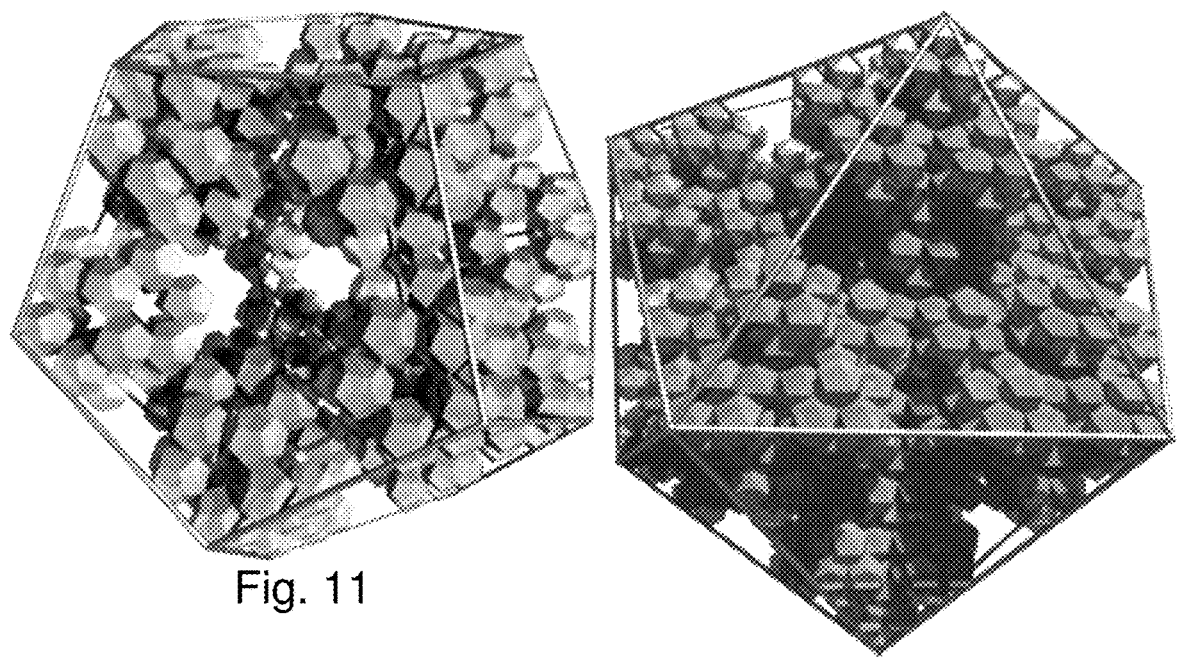
Fig. 11
Fig. 12

FRACTAL HEAT TRANSFER DEVICE

CROSS REFERENCE TO RELATED APPLICATIONS

The present application is a:

Continuation of U.S. patent application Ser. No. 16/056,481, filed Aug. 6, 2018, now U.S. Pat. No. 11,209,220, issued Dec. 28, 2021, which is a Continuation of U.S. patent application Ser. No. 14/984,756, filed Dec. 30, 2015, now U.S. Pat. No. 10,041,745, issued Aug. 7, 2018, which is a Continuation in part of U.S. patent application Ser. No. 14/817,962, filed Aug. 4, 2015, now U.S. Patent No. pending, and is a Continuation in part of U.S. patent application Ser. No. 13/106,640, filed May 12, 2011, now U.S. Pat. No. 9,228,785, issued Jan. 5, 2016, from which PCT/IB11/01026, filed May 13, 2011 claims priority, which is a Non-provisional of, and claims benefit of priority from, U.S. Provisional Patent Application No. 61/331,103, filed May 4, 2010, and the entirety of which are expressly incorporated herein by reference.

FIELD OF THE INVENTION

This invention relates to the field of heatsinks or items that transfer heat between a concentrated source or sink and a fluid.

BACKGROUND OF THE INVENTION

A heat sink is a term for a component or assembly that transfers heat generated within a solid material to a fluid or gas medium, such as air or a liquid. A heat sink is typically designed to increase the surface area in contact with the cooling fluid or gas surrounding it, such as the air. Approach air velocity, choice of material, fin (or other protrusion) design and surface treatment are some of the design factors which influence the thermal resistance, i.e., thermal performance, of a heat sink. See, en.wikipedia.org/wiki/Heat_sink.

Heatsinks operate by removing heat from an object to be cooled into the surrounding air, gas or liquid through convection and radiation. Convection occurs when heat is either carried passively from one point to another by fluid motion (forced convection) or when heat itself causes fluid motion (free convection). When forced convection and free convection occur together, the process is termed mixed convection. Radiation occurs when energy, for example in the form of heat, travels through a medium or through space and is ultimately absorbed by another body. Thermal radiation is the process by which the surface of an object radiates its thermal energy in the form of electromagnetic waves. Infrared radiation from a common household radiator or electric heater is an example of thermal radiation, as is the heat and light (IR and visible EM waves) emitted by a glowing incandescent light bulb. Thermal radiation is generated when heat from the movement of charged particles within atoms is converted to electromagnetic radiation.

A heatsink tends to decrease the maximum temperature of the exposed surface, because the power is transferred to a larger volume. This leads to a possibility of diminishing return on larger heatsinks, since the radiative and convective dissipation tends to be related to the temperature differential between the heatsink surface and the external medium. Therefore, if the heatsink is oversized, the efficiency of heat shedding is poor. If the heatsink is undersized, the object may be insufficiently cooled, the surface of the heatsink dangerously hot, and the heat shedding not much greater than the object itself absent the heatsink.

A heat sink transfers thermal energy from a higher temperature to a lower temperature fluid or gas medium, by a process such as radiation, convection, and diffusion. The fluid medium is frequently air, but can also be water or in the case of heat exchangers, oil, and refrigerants. Fourier's law of heat conduction, simplified to a one-dimensional form in the direction x, shows that when there is a temperature gradient in a body, heat will be transferred from the higher temperature region to the lower temperature region. The rate at which heat is transferred by conduction, $q_k$, is proportional to the product of the temperature gradient and the cross-sectional area through which heat is transferred:

$$q_k = kA\frac{dT}{dx} \quad (1)$$

where $q_k$ is the rate of conduction, k is a constant which depends on the heat-conducting material, A is the surface area through which the heat is conducted, and dT/dx is the temperature gradient, i.e., the rate of change of temperature with respect to distance (for simplicity, the equation is written in one dimension). Thus, according to Fourier's law (which is not the only consideration by any means), heatsinks benefit from having a large surface area exposed to the medium into which the heat is to be transferred.

Consider a heat sink in a duct, where air flows through the duct, and the heat sink base is higher in temperature than the air. Assuming conservation of energy, for steady-state conditions, and applying the convection-cooling law, also known as the Newton's law of cooling, gives the following set of equations.

$$\dot{Q} = \dot{m}c_{p,in}(T_{air,out} - T_{air,in}) \quad (2)$$

$$\dot{Q} = \frac{T_{hs} - T_{air,av}}{R_{hs}} \quad (3)$$

where $$T_{air,av} = \frac{T_{air,out} + T_{air,in}}{2} \quad (4)$$

and $\dot{Q}$ is the first derivative of the thermal energy over time—

$$\dot{Q} = \frac{dQ}{dt}.$$

Using the mean air temperature is an assumption that is valid for relatively short heat sinks. When compact heat exchangers are calculated, the logarithmic mean air temperature is used. $\dot{m}$ is the first derivative of mass over time, i.e., the air mass flow rate in kg/s.

The above equations show that when the airflow through or around the heat sink decreases, this results in an increase in the average air temperature. This in turn increases the heat sink base temperature. Additionally, the thermal resistance of the heat sink will also increase. The net result is a higher heat sink base temperature. The inlet air temperature relates strongly with the heat sink base temperature. Therefore, if there is no air or fluid flow around the heat sink, the energy dissipated to the air cannot be transferred to the ambient air. Therefore, the heat sink functions poorly.

Other examples of situations, in which a heat sink has impaired efficiency: (a) pin fins have a lot of surface area, but the pins are so close together that air has a hard time flowing through them; (b) aligning a heat sink so that the fins are not in the direction of flow; (c) aligning the fins horizontally for a natural convection heat sink. Whilst a heat sink is stationary and there are no centrifugal forces and artificial gravity, air that is warmer than the ambient temperature always flows upward, given essentially-still-air surroundings; this is convective cooling.

The most common heat sink material is aluminum. Chemically pure aluminum is not used in the manufacture of heat sinks, but rather aluminum alloys. Aluminum alloy 1050A has one of the higher thermal conductivity values at 229 W/m·K. However, it is not recommended for machining, since it is a relatively soft material. Aluminum alloys 6061 and 6063 are the more commonly used aluminum alloys, with thermal conductivity values of 166 and 201 W/m·K, respectively. The aforementioned values are dependent on the temper of the alloy.

Copper is also used since it has around twice the conductivity of aluminum, but is three times as heavy as aluminum. Copper is also around four to six times more expensive than aluminum, but this is market dependent. Aluminum has the added advantage that it is able to be extruded, while copper cannot. Copper heat sinks are machined and skived. Another method of manufacture is to solder the fins into the heat sink base.

Another heat sink material that can be used is diamond. With a thermal conductivity value of 2000 W/m·K, it exceeds that of copper by a factor of five. In contrast to metals, where heat is conducted by delocalized electrons, lattice vibrations are responsible for diamond's very high thermal conductivity. For thermal management applications, the outstanding thermal conductivity and diffusivity of diamond are essential. CVD diamond may be used as a submount for high-power integrated circuits and laser diodes.

Composite materials also can be used. Examples are a copper-tungsten pseudoalloy, AlSiC (silicon carbide in aluminum matrix), Dymalloy (diamond in copper-silver alloy matrix), and E-Material (beryllium oxide in beryllium matrix). Such materials are often used as substrates for chips, as their thermal expansion coefficient can be matched to ceramics and semiconductors.

Fin efficiency is one of the parameters which make a higher thermal conductivity material important. A fin of a heat sink may be considered to be a flat plate with heat flowing in one end and being dissipated into the surrounding fluid as it travels to the other. As heat flows through the fin, the combination of the thermal resistance of the heat sink impeding the flow and the heat lost due to convection, the temperature of the fin and, therefore, the heat transfer to the fluid, will decrease from the base to the end of the fin. This factor is called the fin efficiency and is defined as the actual heat transferred by the fin, divided by the heat transfer were the fin to be isothermal (hypothetically the fin having infinite thermal conductivity). Equations 5 and 6 are applicable for straight fins.

$$\eta_f = \frac{\tanh(mL_c)}{mL_c} \quad (5)$$

$$mL_c = \sqrt{\frac{2h_f}{kt_f}} L_f \quad (6)$$

where:
$h_f$ is the convection coefficient of the fin
  Air: 10 to 100 W/(m²·K)
  Water: 500 to 10,000 W/(m²·K)
k is the thermal conductivity of the fin material
  Aluminum: 120 to 240 W/(m²·K)
$L_f$ is the fin height (m)
$t_f$ is the fin thickness (m)

Another parameter that concerns the thermal conductivity of the heat sink material is spreading resistance. Spreading resistance occurs when thermal energy is transferred from a small area to a larger area in a substance with finite thermal conductivity. In a heat sink, this means that heat does not distribute uniformly through the heat sink base. The spreading resistance phenomenon is shown by how the heat travels from the heat source location and causes a large temperature gradient between the heat source and the edges of the heat sink. This means that some fins are at a lower temperature than if the heat source were uniform across the base of the heat sink. This non-uniformity increases the heat sink's effective thermal resistance.

A pin fin heat sink is a heat sink that has pins that extend from its base. The pins can be, for example, cylindrical, elliptical or square/geometric polygonal. A second type of heat sink fin arrangement is the straight fin. These run the entire length of the heat sink. A variation on the straight fin heat sink is a cross cut heat sink. A straight fin heat sink is cut at regular intervals but at a coarser pitch than a pin fin type.

In general, the more surface area a heat sink has, the better it works. However, this is not always true. The concept of a pin fin heat sink is to try to pack as much surface area into a given volume as possible. As well, it works well in any orientation. Kordyban has compared the performance of a pin fin and a straight fin heat sink of similar dimensions. Although the pin fin has 194 cm² surface area while the straight fin has 58 cm², the temperature difference between the heat sink base and the ambient air for the pin fin is 50° C. For the straight fin it was 44° C. or 6° C. better than the pin fin. Pin fin heat sink performance is significantly better than straight fins when used in their intended application where the fluid flows axially along the pins rather than only tangentially across the pins. See, Kordyban, T., Hot air rises and heat sinks—Everything you know about cooling electronics is wrong, ASME Press, N Y 1998.

Another configuration is the flared fin heat sink; its fins are not parallel to each other, but rather diverge with increasing distance from the base. Flaring the fins decreases flow resistance and makes more air go through the heat sink fin channel; otherwise, more air would bypass the fins. Slanting them keeps the overall dimensions the same, but offers longer fins. Forghan, et al. have published data on tests conducted on pin fin, straight fin and flared fin heat sinks. See, Forghan, F., Goldthwaite, D., Ulinski, M., Metghalchi, M., Experimental and Theoretical Investigation of Thermal Performance of Heat Sinks, ISME, May. 2001. They found that for low approach air velocity, typically around 1 m/s, the thermal performance is at least 20% better than straight fin heat sinks. Lasance and Eggink also found that for the bypass configurations that they tested, the flared heat sink performed better than the other heat sinks tested. See, Lasance, C. J. M and Eggink, H. J., A Method to Rank Heat Sinks in Practice: The Heat Sink Performance Tester, 21st IEEE SEMI-THERM Symposium 2001.

The heat transfer from the heatsink is mediated by two effects: conduction via the coolant, and thermal radiation. The surface of the heatsink influences its emissivity; shiny metal absorbs and radiates only a small amount of heat, while matte black is a good radiator. In coolant-mediated heat transfer, the contribution of radiation is generally small. A layer of coating on the heatsink can then be counterproductive, as its thermal resistance can impair heat flow from the fins to the coolant. Finned heatsinks with convective or forced flow will not benefit significantly from being colored. In situations with significant contribution of radiative cooling, e.g. in case of a flat non-finned panel acting as a heatsink with low airflow, the heatsink surface finish can play an important role. Matte-black surfaces will radiate much more efficiently than shiny bare metal. The importance of radiative vs. coolant-mediated heat transfer increases in situations with low ambient air pressure (e.g., high-altitude operations) or in vacuum (e.g., satellites in space).

Fourier, J. B., 1822, Theorie analytique de la chaleur, Paris; Freeman, A., 1955, translation, Dover Publications, Inc, NY.

Kordyban, T., 1998, Hot air rises and heat sinks—Everything you know about cooling electronics is wrong, ASME Press, NY.

Anon, Unknown, "Heat sink selection", Mechanical engineering department, San Jose State University [27 Jan. 2010]. www.engr.sjsu.edu/ndejong/ME%20146%20files/ Heat%20Sink.pptwww.engr.sjsu.edu/ndejong/ ME%20146%20files/Heat%20Sink.ppt Sergent, J. and Krum, A., 1998, Thermal management handbook for electronic assemblies, First Edition, McGraw-Hill.

Incropera, F. P. and DeWitt, D. P., 1985, Introduction to heat transfer, John Wiley and sons, NY.

Forghan, F., Goldthwaite, D., Ulinski, M., Metghalchi, M., 2001, Experimental and Theoretical Investigation of Thermal Performance of Heat Sinks, ISME May.

Lasance, C. J. M and Eggink, H. J., 2001, A Method to Rank Heat Sinks in Practice: The Heat Sink Performance Tester, 21st IEEE SEMI-THERM Symposium.

ludens.cl/Electron/Thermal.html

Lienard, J. H., IV & V, 2004, A Heat Transfer Textbook, Third edition, MIT

Saint-Gobain, 2004, "Thermal management solutions for electronic equipment" 22 Jul. 2008 www.fff.saint-gobain-.com/Media/Documents/S0000000000000001036/ ThermaCool%20Brochure.pdf Jeggels, Y. U., Dobson, R. T., Jeggels, D. H., Comparison of the cooling performance between heat pipe and aluminium conductors for electronic equipment enclosures, Proceedings of the 14th International Heat Pipe Conference, Florianópolis, Brazil, 2007.

Prstic, S., Iyengar, M., and Bar-Cohen, A., 2000, Bypass effect in high performance heat sinks, Proceedings of the International Thermal Science Seminar Bled, Slovenia, June 11-14. Mills, A. F., 1999, Heat transfer, Second edition, Prentice Hall.

Potter, C. M. and Wiggert, D. C., 2002, Mechanics of fluid, Third Edition, Brooks/Cole.

White, F. M., 1999, Fluid mechanics, Fourth edition, McGraw-Hill International.

Azar, A, et al., 2009, "Heat sink testing methods and common oversights", Qpedia Thermal E-Magazine, January 2009 Issue.

www.qats.com/cpanel/UploadedPdf/January20092.pdf

Several structurally complex heatsink designs are discussed in Hernon, US App. 2009/0321045, incorporated herein by reference.

The relationship between friction and convention in heatsinks is discussed by Frigus Primore in "A Method for Comparing Heat Sinks Based on Reynolds Analogy," available at www.frigprim.com/downloads/Reynolds_ analogy_heatsinks.PDF, last accessed Apr. 28, 2010. This article notes that for, plates, parallel plates, and cylinders to be cooled, it is necessary for the velocity of the surrounding fluid to be low in order to minimize mechanical power losses. However, larger surface flow velocities will increase the heat transfer efficiency, especially where the flow near the surface is turbulent, and substantially disrupts a stagnant surface boundary layer. Primore also discusses heatsink fin shapes and notes that no fin shape offers any heat dissipation or weight advantage compared with planar fins, and that straight fins minimize pressure losses while maximizing heat flow. Therefore, the art generally teaches that generally flat and planar surfaces are appropriate for most heatsinks.

Frigus Primore, "Natural Convection and Inclined Parallel Plates," www.frigprim.com/articels2/paral-lel_pl_Inc.html, last accessed Apr. 29, 2010, discusses the use of natural convection (i.e., convection due to the thermal expansion of a gas surrounding a solid heatsink in normal operating conditions) to cool electronics. One of the design goals of various heatsinks is to increase the rate of natural convection. Primore suggests using parallel plates to attain this result. Once again, Primore notes that parallel plate heat sinks are the most efficient and attempts to define the optimal spacing and angle (relative to the direction of the fluid flow) of the heat sinks according to the below equations referencing the structures shown in FIG. 1:

Optimum Plate Spacing $$S_{opt} = k_s \left(\frac{L}{dT}\right)^{0.25} \cdot \cos(\gamma)^{-0.25} \quad (1)$$

$$\gamma_{opt} = a\tan\left(\frac{1}{3}\frac{H}{W}\right) \qquad \frac{H}{W} < \sqrt{3}$$

$$\gamma_{opt} = \frac{\pi}{4} - 0.508\left(\frac{H}{W}\right)^{-1.237} \qquad \frac{H}{W} > \sqrt{3}$$

Total Heat Dissipation $$\dot{Q} = k_v \cdot k_\gamma \cdot A_c \cdot H^{0.5} \cdot dT^{1.5} \quad (2)$$

$$k_\gamma = \sqrt{1 + \frac{1}{9}\left(\frac{H}{W}\right)^2} \qquad \frac{H}{W} < \sqrt{3}$$

$$k_\gamma = 0.307 \cdot \left(\frac{H}{W}\right)^{-0.5} + 0696 \cdot \left(\frac{H}{W}\right)^{-0.5} \quad \frac{H}{W} > \sqrt{3}$$

Applied Equation $$\dot{Q} = \eta_v \cdot k_v \cdot k_\gamma \cdot A_c \cdot H^{0.5} \cdot dT_{ref}^{1.5}$$

dT=Temperature difference (K)

$$A_c = W \cdot D \quad (3)$$

$\eta_v$=Volumetric efficiency [- -]

$\dot{Q}$=Heat dissipation [W]

In another article titled "Natural Convection and Chimneys," available at www.frigprim.com/articels2/paral-lel_plchim.html, last accessed Apr. 29, 2010, Frigus Primore discusses the use of parallel plates in chimney heat sinks. One purpose of this type of design is to combine more efficient natural convection with a chimney. Primore notes that the design suffers if there is laminar flow (which creates a re-circulation region in the fluid outlet, thereby completely eliminating the benefit of the chimney) but benefits if there is turbulent flow which allows heat to travel from the parallel plates into the chimney and surrounding fluid.

Batten, Paul, et al. "Sub-Grid Turbulence Modeling for Unsteady Flow with Acoustic Resonance," available at www.metacomptech.com/cfd++/00-0473.pdf, last accessed Apr. 29, 2010, expressly incorporated herein by reference, discuss that when a fluid is flowing around an obstacle, localized geometric features, such as concave regions or cavities, create pockets of separated flow which can generate self-sustaining oscillations and acoustic resonance. The concave regions or cavities serve to substantially reduce narrow band acoustic resonance as compared to flat surfaces. This is beneficial to a heat sink in a turbulent flow environment because it allows for the reduction of oscillations and acoustic resonance, and therefore for an increase in the energy available for heat transfer.

Liu, S., et al., "Heat Transfer and Pressure Drop in Fractal Microchannel Heat Sink for Cooling of Electronic Chips," 44 Heat Mass Transfer 221 (2007), discuss a heatsink with a "fractal-like branching flow network." Liu's heatsink includes channels through which fluids would flow in order to exchange heat with the heatsink.

Y. J. Lee, "Enhanced Microchannel Heat Sinks Using Oblique Fins," IPACK 2009-89059, similarly discusses a heat sink comprising a "fractal-shaped microchannel based on the fractal pattern of mammalian circulatory and respiratory system." Lee's idea, similar to that of Liu, is that there would be channels inside the heatsink through which a fluid could flow to exchange heat with the heatsink. The stated improvement in Lee's heatsink is (1) the disruption of the thermal boundary layer development; and (2) the generation of secondary flows.

Pence, D. V., 2002, "Reduced Pumping Power and Wall Temperature in Microchannel Heat Sinks with Fractal-like Branching Channel Networks", Microscale Thermophys. Eng. 5, pp. 293-311, mentions heatsinks that have fractal-like channels allowing fluid to enter into the heat sink. The described advantage of Pence's structure is increased exposure of the heat sink to the fluid and lower pressure drops of the fluid while in the heatsink.

In general, a properly designed heatsink system will take advantage of thermally induced convection or forced air (e.g., a fan 191). In general, a turbulent flow near the surface of the heatsink disturbs a stagnant surface layer, and improves performance. In many cases, the heatsink operates in a non-ideal environment subject to dust or oil; therefore, the heatsink design must accommodate the typical operating conditions, in addition to the as-manufactured state.

Therefore, two factors appear to conflict in optimizing the configuration of an external surface: the surface configuration designed to disturb laminar flow patterns, create turbulence, and enhance convective heat transfer, and the desire to efficiently flow large volumes of heat transfer fluid (e.g., air), over the surfaces, which is enhanced by laminar (smooth) flow. Even in passive dissipative device, convective flow may be a significant factor, and reducing air flow volume and velocity by increasing the effective impedance can be counterproductive. On the other hand, in some cases, the amount of energy necessary to move the air is dwarfed by the problem to be solved. In many computing systems, the processors are thermally constrained, that is, the functioning of the processor is limited by the ability to shed heat. In such cases, innovative ways to improve the efficiency of heat transfer may yield significant benefit, even if in some regimes of operation they impose certain inefficiencies.

Prior art heatsink designs have traditionally concentrated on geometry that is Euclidian, involving structures such as the pin fins, straight fins, and flares discussed above.

N J Ryan, D A Stone, "Application of the FD-TD method to modelling the electromagnetic radiation from heatsinks", IEEE International Conference on Electromagnetic Compatibility, 1997. 10th (1-3 Sep. 1997), pp: 119-124, discloses a fractal antenna which also serves as a heatsink in a radio frequency transmitter.

Lance Covert, Jenshan Lin, Dan Janning, Thomas Dalrymple, "5.8 GHz orientation-specific extruded-fin heatsink antennas for 3D RF system integration", 23 Apr. 2008 DOI: 10.1002/mop.23478, Microwave and Optical Technology Letters Volume 50, Issue 7, pages 1826-1831, July 2008 also provide a heatsink which can be used as an antenna.

SUMMARY OF THE INVENTION

Most heatsinks are designed using a linear or exponential relationship of the heat transfer and dissipating elements. A known geometry which has not generally been employed is fractal geometry. Some fractals are random fractals, which are also termed chaotic or Brownian fractals and include random noise components. In deterministic fractal geometry, a self-similar structure results from the repetition of a design or motif (or "generator") using a recursive algorithm, on a series of different size scales. As a result, certain types of fractal images or structures appear to have self-similarity over a broad range of scales. On the other hand, no two ranges within the design are identical.

A fractal is defined as "a rough or fragmented geometric shape that can be split into parts, each of which is (at least approximately) a reduced-size copy of the whole." Mandelbrot, B. B. (1982). That is, there is a recursive algorithm which describes the structure. The Fractal Geometry of Nature. W. H. Freeman and Company. ISBN 0-7167-1186-9. This property is termed "self-similarity." For a more detailed discussion of fractals, see the Wikipedia article thereon at en.wikipedia.org/wiki/Fractal incorporated herein by reference. Exemplary images of well-known fractal designs can also be viewed on the Wikipedia page. Due to the fact that fractals involve largely self-repeating patterns, each of which serves to increase the surface area in three-dimensional fractals (perimeter in two-dimensional fractals), three dimensional fractals in theory are characterized by infinite surface area (and two-dimensional fractals are characterized by infinite perimeter). In practical implementations, the scale of the smallest features, which remain true to the generating algorithm, may be 3-25 iterations of the algorithm. Less than three recursions, and the fractal nature is not apparent, while present manufacturing technologies limit the manufacture of objects with a large range of feature scales.

Fractal theory is related to chaos theory. See, en.wikipedia.org/wiki/Chaos_theory, expressly incorporated herein by reference. See, Sui, Y., Teo, C. J., Lee, P. S., Chew, Y. T., & Shu, C. (2010). Fluid flow and heat transfer in wavy microchannels. International Journal of Heat and Mass Transfer, 53(13), 2760-2772; Garibaldi, Dott Ing Pietro. Single-phase natural circulation loops: effects of geometry and heat sink temperature on dynamic behavior and stability. Diss. Ph. D. Thesis, 2008; Fichera, A., and A. Pagano. "Modelling and control of rectangular natural circulation loops." International journal of heat and mass transfer 46.13

(2003): 2425-2444; Fichera, Alberto, et al. "A modeling strategy for rectangular thermal convection loops." World Congress. Vol. 15. No. 1. 2002; Crane, Jackson T. Radial parallel plate flow with mechanical agitation. Diss. Massachusetts Institute of Technology, 2013, each of which is expressly incorporated herein by reference.

This fractal nature is useful in a heatsink because the rate at which heat is transferred from a surface, either through convection or through radiation, is typically related to, and increasing with, the surface area. Of course, due to limitations in the technology used to build these heatsinks, engineering compromise is expected. However, a feature of an embodiment of the designs proposed herein is that vortices induced by fluid flow over a heat transfer surface will be chaotically distributed over various elements of the surface, thus disrupting the stagnant surface boundary layer and increasing the effective surface area available for heat transfer, while avoiding acoustic resonance which may be apparent from a regular array of structures which produce vortices and turbulence.

Further, a large physical surface area to volume ratio, which is generally useful in heatsink design, can still be obtained using the fractal model. In addition, fractal structures provide a plurality of concave regions or cavities, providing pockets of separated flow which can generate self-sustaining oscillations and acoustic resonance. These pockets serve to reduce the acoustic resonance in turbulent flowing fluid (as compared to flat or Euclidian surfaces), thus allowing for more effective heat transfer between the fractal structure and the surrounding fluid, thereby making the fractal structure ideal for a heatsink.

U.S. Pat. No. 7,256,751, issued to Cohen, incorporated herein by reference, discusses fractal antennas. In the background of this patent, Cohen discusses Kraus' research, noting that Euclidian antennas with low area (and therefore low perimeter) exhibit very low radiation resistance and are thus inefficient. Cohen notes that the advantages of fractal antennas, over traditional antennas with Euclidian geometries, is that they can maintain the small area, while having a larger perimeter, allowing for a higher radiation resistance. Also, Cohen's fractal antenna features non-harmonic resonance frequencies, good bandwidth, high efficiency, and an acceptable standing wave ratio.

In the instant invention, this same wave theory may be applied to fractal heatsinks, especially with respect to the interaction of the heat transfer fluid with the heatsink. Thus, while the heat conduction within a solid heatsink is typically not modeled as a wave (though modern thought applies phonon phenomena to graphene heat transport), the fluid surrounding the heating certainly is subject to wave phenomena, complex impedances, and indeed the chaotic nature of fluid eddies may interact with the chaotic surface configuration of the heatsink.

The efficiency of capturing electric waves in a fractal antenna, achieved by Cohen, in some cases can be translated into an efficiency transferring heat out of an object to be cooled in a fractal heatsink as described herein. See, Boris Yakobson, "Acoustic waves may cool microelectronics", Nano Letters, ACS (2010). Some physics scholars have suggested that heat can be modeled as a set of phonons. Convection and thermal radiation can therefore be modeled as the movement of phonons. A phonon is a quasiparticle characterized by the quantization of the modes of lattice vibration of solid crystal structures. Any vibration by a single phonon is in the normal mode of classical mechanics, meaning that the lattice oscillates in the same frequency. Any other arbitrary lattice vibration can be considered a superposition of these elementary vibrations. Under the phonon model, heat travels in waves, with a wavelength on the order of 1 µm. In most materials, the phonons are incoherent, and, therefore, on macroscopic scales, the wave nature of heat transport is not apparent or exploitable.

The thermodynamic properties of a solid are directly related to its phonon structure. The entire set of all possible phonons combine in what is known as the phonon density of states which determines the heat capacity of a crystal. At absolute zero temperature (0 Kelvin or −273 Celsius), a crystal lattice lies in its ground state, and contains no phonons. A lattice at a non-zero temperature has an energy that is not constant, but fluctuates randomly about some mean value. These energy fluctuations are caused by random lattice vibrations, which can be viewed as a gas-like structure of phonons or thermal phonons. However, unlike the atoms which make up an ordinary gas, thermal phonons can be created and destroyed by random energy fluctuations. In the language of statistical mechanics this means that the chemical potential for adding a phonon is zero. For a more detailed description of phonon theory, see the Wikipedia article thereon available at en.wikipedia.org/wiki/Phonon (last accessed Apr. 16, 2010) incorporated herein by reference.

In certain materials, such as graphene, phonon transport phenomena are apparent at macroscopic levels, which make phonon impedance measurable and useful. Thus, if a graphene sheet were formed to resonate at a particular phonon wavelength, the resonant energy would not be emitted. On the other hand, if the graphene sheet were configured using a fractal geometry, the phonon impedance would be well controlled over a broad range of wavelengths, with sharp resonances at none, leading to an efficient energy dissipation device.

One aspect of the technology therefore employs a thermally responsive technology, such as a memory metal actuator (which may be passive or active), or other active or passive element, to change the configuration of the heatsink under various conditions. It is noted that in an automotive radiator, a thermostat is provided to shunt flow around the radiator when the engine is cool. This is distinguished herein, in various alternate ways. For example, a variable geometry heatsink according to the present technology may have an external surface exposed to an unconstrained heat transfer medium, such as air. See, Baurle, R. A., and D. R. Eklund. "Analysis of dual-mode hydrocarbon scramjet operation at Mach 4-6.5." *Journal of Propulsion and Power* 18.5 (2002): 990-1002; Cockrell Jr, Charles E. "Technology Roadmap for Dual-Mode Scramjet Propulsion to Support Space-Access Vision Vehicle Development." (2002); Boudreau, Albert H. "Hypersonic air-breathing propulsion efforts in the air force research laboratory." *AIAA* 3255.1 (2005): 10; Kay, Ira W., W. T. Peschke, and R. N. Guile. "Hydrocarbon-fueled scramjet combustor investigation." *Journal of Propulsion and Power* 8.2 (1992): 507-512; Jackson, K., et al. "Calibration of a newly developed direct-connect high-enthalpy supersonic combustion research facility." *AIAA paper* (1998): 98-1510; Donbar, J., et al. "Post-test analysis of flush-wall fuel injection experiments in a scramjet." *AIAA Paper* 3197 (2001): 2001; Gruber, Mark, et al. "Newly developed direct-connect high-enthalpy supersonic combustion research facility." *Journal of Propulsion and Power* 17.6 (2001): 1296-1304; Andrews, Earl H. "Scramjet development and testing in the United States." *AIAA paper* 1927 (2001): 2001; Palac, Donald T., Charles J. Trefny, and Joseph M. Roche. *Performance Evaluation of the NASA GTX RBCC Flowpath*. National Aeronautics and Space Administration, Glenn Research Center, 2001; 2003/0155110; 2004/0187861; 2005/0245659; 2009/0016019; 2009/0321047; 2010/0089549; 2010/0236236; 2010/0252648; 2011/0174462; 2012/0293952; 2014/0360699; 4,654,092; 4,931,626; 5,371,753; 5,483,098; 5,548,481; 5,510,598; 6,128,188; 6,330,157; 6,689,486; 7,080,989; 7,778,029; 8,228,671; 8,385,066; JP 03-070162; JP 04-291750; JP 61-098565; JP 63-006915; WO 99/04429, each of which is expressly incorporated herein by reference in its entirety.

For example, in one embodiment, a thermodynamic model of the system, encompassing at least the heat source, the heat sink, the thermal transfer medium, and a device to induce thermal transfer medium flow, determines, under each set of conditions, the optimal configuration. For example, at low loads, the heat sink may operate passively, without flows induced by an active device to induce flow in the thermal transfer medium. In such a case, radiative heat transfer may be important, as well as thermally-induced convection. Under high loads, the active device to induce flow in the thermal transfer medium may induce maximum flows, and the heatsink configured for minimal turbulence with laminar flows where possible. In intermediate states, the system may assume a configuration which is optimized according to a cost function, which may involve the effect of heat/temperature on the heat source, energy consumed by the active device to induce flow in the thermal transfer medium, noise resulting from induced flow, etc. This allows efficient use of an "oversized" heatsink, since the heatsink characteristics are variably controlled. In these intermediate states of configuration, efficiency may be improved by allowing the heatsink to assume a variable configuration. Since the optimum heatsink configuration depends on, e.g., ambient temperature, humidity, atmospheric pressure, heat load, air flow rate, gravitational vector with respect to the heatsink, etc., the model should explore the range of combinations of the device to induce thermal transfer medium flow, the variable geometry, and to a lesser extent, control over the heat source. An example of the later is that for a given power dissipation, it may be more efficient to have thermal cycles reaching a maximum temperature than a constant temperature. During the cycles, the geometry may change. Indeed, if the system is not in a static steady state, the geometry may optimally change during or in anticipation of temperature changes. An example here is that as the heat source produces a heat peak, the heat diffuses over time through a solid heatsink material. There is a lag, and so the temperature of the heat source is different that the temperature of the heatsink, and the heatsink itself has variations in temperature at different positions. Typically, there is a single actuator which controls the entire heatsink, though this is not a limitation, and there may be multiple actuators to control different parts of the heatsink independently or semi-independently. The device to induce thermal transfer medium flow may have a variable flow rate, and may also have multiple independently controlled portions. However, as the heat begins to peak, the device to induce thermal transfer medium flow may also increase activity. This, in turn, can reduce the temperature of various portions of the heatsink, depending on the relationship of the device to induce thermal transfer medium flow and the variable geometry heatsink. Thus, the entire system may operate in a phased cyclic or dynamic manner, with asynchronous maxima and minima of the various functions.

In practice, a heatsink may be provided for a microprocessor having multiple cores. Under low load, the device to induce thermal transfer medium flow may be off, or at a low flow rate. The heatsink in this case optimally has the greatest spread for radiative and passive convective cooling. In case of a higher load, the processor itself may have the option of distributing the load over multiple cores, and spatially spreading the heat dissipation, or concentrating the load in a single core which may get hot. Since temperature differentials increase heat flow, the concentrated heat source may selectively transfer heat to sub-portion of the heatsink, and thus that portion may be able to efficiently shed the heat under the passive or low energy cost state. As the load further increases, the processor as a whole typically becomes thermally limited, and as a result, the entire die or processor complex is treated as a unitary source, spreading heat to all elements of the heatsink. Initially, the temperature is low, and the system would seek to operate in the most efficient state of the device to induce thermal transfer medium flow. This may include laminar flow over the heat dissipating elements of the heatsink. In the next regime, the heat increases, and as a result, the device to induce thermal transfer medium flow must increase its flow rate. At this point, a compromise may be made, between minimum energy cost (and thus a minimization of the energy to drive the device to induce thermal transfer medium flow), and effective heat dissipation. In this regime, the heatsink may be configured to induce turbulence in the medium flow around it. This, in turn, increases the resistance to flow, but reduces the boundary layer effect. Advantageously, in this regime, a fractal physical relationship of element of the heatsink may act to reduce peak acoustic emission with respect to frequency. Likewise, by avoiding sharp acoustic resonances, there may be a more effective transfer of heat with lower losses as acoustic energy. Further, the interaction of the elements of the heatsink may be further optimized to achieve higher efficiency. Finally, at maximum heat load, presumably at the limit of the heatsink, the system enters a maximum heat dissipation mode. For example, this mode is one traditionally analyzed as the maximum capacity of the heatsink and device to induce thermal transfer medium flow system, and as such would typically assume or nearly assume a traditional optimized geometry. However, both due to the fact that the system may include fractal geometry elements for other regimes of operation, and because these may be exploited to gain efficiencies over traditional symmetric and regular geometries, the maximum heart dissipation configuration may be somewhat different from a parallel plate heatsink, for example. Note that not all regions of the heatsink need to operate within the same regime at the same time, and even under a steady state heat load, may vary cyclically, randomly or chaotically (over a relevant timescale). In this case, the term "chaotically" is intended to assume its technical meaning under chaos and fractal theory, and not adopt a lay interpretation. On the other hand, "randomly" is intended to encompass true randomness, pseudorandom variations, and deterministic changes that over the relevant timescale have statistical characteristics that model randomness within an acceptable margin of error, the acceptability relating to achieving a suitable regime of operation. For example, because some attributes of turbulent flow are random, even though they are more technically chaotic, the random features may be used to advantage. For example, the device to induce thermal transfer medium flow may be subject to a tinsel type flow disruptor, which in some regimes appears to be a random variation in air flow speed, direction, vortex, etc. While this may increase noise, it also can create persistent disruptions in boundary layers, even on smooth and regular heatsink elements. That is, either the heatsink geometry and the device to induce thermal transfer medium flow, or both, may have fractal or chaotic tendencies.

According to one embodiment, the geometry involves branching elements, to increase surface area of the elements. An actuator may be used to alter angles or even to open and close branches. For example, a heatsink formed of a shape memory alloy (SMA) (such as Nitinol), may be produced by an additive manufacturing process, e.g., a 3D printer or 2.5D printer. Such a device may be thermally processed to have characteristic shape changes at temperature transitions, and indeed, the composition of the alloy may be controlled during fabrication to produce a variety of transition temperatures. Therefore, a 3D heatsink may be provided which inherently changes shape through a series of transitions as the temperature is increased and decreased. In this embodiment, the changes tend to be monotonic with increasing temperature, though by engineering the angles and physical configuration, the actual physical shape and heat dissipation properties may assume a non-monotonic function. Note that in this embodiment, it is generally preferred that only the branch points are formed of SMA 163, and the bulk be formed of a high thermal conductivity material, such as copper and/or silver, or to a lesser extent, aluminum.

According to another embodiment, actuators, which may be SMA, solenoids, or otherwise, are controlled to change the position of repositionable elements. In this case, independent control can be exercised which is not dependent on temperature, but typically, the number of controlled elements is more constrained due to manufacturing and control feasibility issues. The actuators may alter a spacing, angle, position, or engagement of heat sink elements. When a set of regularly spaced and sized elements are controlled according to a constant or spectrally-defined distribution, this can be controlled to operate within highly predictable regimes. On the other hand, if the elements are not regularly sized and spaced, or are controlled in irregular manner, the resulting fluid dynamics will likely require a statistical flow (e.g., Monte Carlo) analysis, rather than a simplifying presumption of static function. This will especially be the case if the thermal timeconstants of the heat flow from the heat source, to the heatsink, and then to the heat transfer fluid, are near or within the range of timeconstants of the turbulence or chaotically varying flows of the heat transfer fluid. Typically, the thermal heat transfer timeconstants are longer than the turbulent or chaotic variation timeconstants, and therefore this meeting this presumption requires either generating low frequency turbulent or chaotic variations of the heat transfer fluid medium, or making the heatsink (and perhaps other elements) with short timeconstants, such as using short/thin/small elements, using phonon transport phenomena, or other means.

In another embodiment, the timeconstant(s) of the thermal transfer medium flow is much shorter than the relevant thermal timconstants of the heat source and heatsink, and the purpose of the turbulent or chaotic disruption is to alter the convective heat transfer characteristics of the heatsink, such as reducing the boundary layers or making them dynamically changing over time and space.

Another aspect of the technology involves planar heatsinks, such as used in antenna designs. In this case, the present technology may have corresponding effect to that discussed above, especially where a device to induce thermal transfer medium flow is provided to cool a generally planar heatsink system. It is noted that any heatsink, in actuality, must be considered in three dimensions, and the fact that it may have expanses of a thin uniform thickness layer does not defeat use of three-dimensional analysis to understand its functioning and optimization. In the case of a printed circuit board-type heatsink, a variable geometry is typically infeasible. Similarly, there a planar heatsink structure serves a secondary purpose, such as an antenna, the physical configuration is constrained by this other purpose. However, the device to induce thermal transfer medium flow is typically not so constrained, and therefore provides a controllable variable. Further, in many cases, the requirement for "thinness" of a 2D heatsink does not preclude texturing on an exposed surface, which itself may have a fractal variation. In some cases, a variable geometry may be achieved by altering flow characteristics of thermal transfer medium flow, and for example, a deflector may be controlled to change a direction of impingement. Advantageously, a surface of a heatsink can have anisotropic features, which respond differently to different flow direction. Thus, the efficiency of the fan can be optimized other than by fan speed alone, to provide another control variable. This may have particular importance where the fan itself is highly constrained, and cannot simply be made oversized, or where energy efficiency is an overriding concern.

The technology is not limited to cooling gas fluids, and may encompass liquids. Typically, cooling liquids are recycled, and therefore operate within a physically closed system. Use of fractal branching fluid networks is known, but various principles discussed above, such as variable geometry, variations in flow rate over different regimes of operation, different directions of flow over surfaces, and intentional induction of chaotic flow patterns may be adopted to advantage.

Many fractal designs are characterized by concave regions or cavities. See, for example, FIGS. 2 and 3. While sets of concavities may be useful in improving aerodynamics and fluid dynamics to increase turbulence, if they are disposed in a regular array, they will likely produce an acoustic resonance, and may have peaks in a fluid impedance function. On the other hand, the multiscale nature of a fractal geometric design will allow the system to benefit from the concavities, while avoiding a narrowly tuned system.

The present technology proposes, according to one embodiment, a fractal-shaped heatsink for the purpose of dissipating heat. Benefits of a fractal heatsink, over a traditional heatsink having a Euclidian geometry may include: (1) the fractal heatsink has a greater surface area, allowing for more exposure of the hot device to the surrounding air or liquid and faster dissipation of heat; and (2) due to the plethora of concave structures or cavities in fractal structures, the fractal heatsink is better able to take advantage of turbulent flow mechanics than a traditional heatsink, resulting in heat entering and exiting the heatsink more quickly (3) acoustic properties, especially in forced convection systems.

The technology provides, according to various embodiments, a heatsink to cool an object through conduction (diffusion), convection and radiation. See, en.wikipedia.org/wiki/Heat_transfer.

With respect to conduction, the present technology observes that when heat energy is conducted by phonon transport, wave phenomena are pertinent, and thus a fractal branching network can advantageously be used to reduce reflections at discontinuities and decrease complex impedance. Further, a fractal geometry may assist in optimizing the cross-section area and surface area (for radiation and convective transfer) under given constraints.

With respect to convection, a fractal geometry may provide acoustic benefits, by distributing acoustic energy across a wide band, and thus ensuring "whiteness" of a noise spectrum and absence of sharp resonances. Further, a fractal geometry may provide high or maximum surface area, and produce turbulent cooling medium flows to reduce boundary later effects. Depending on the constraints imposed, a fractal geometry may also provide chimneys or defined flow paths through a network of elements, and thus control an impedance of coolant flow, though generally, a fractal branching network will produce higher flow impedance than corresponding smooth regular surfaces. In some cases, a textured surface or configuration (as might be achieved by a fractal geometry) can actually increase laminar flow some distance away from the surface, by creating a controlled disturbed intermediate layer.

With respect to radiation, a fractal geometry can avoid parallel surfaces which can limit radiative dissipation. For example, a parallel plate heatsink will radiatively transfer heat between the plates, and thus limit the effectiveness of radiation from the bulk of the surfaces as an effective dissipation mechanism. On the other hand, irregular angles and surface branches may help to avoid reabsorption of thermal radiation by the elements of the heatsink, and thus enhance radiative dissipation.

For the smallest heatsink elements, on the order of 10-100 nm, the focus of the heat transfer may be on radiation rather than convection. Electron emission and ionization may also be relevant. Larger heatsink elements, approximately >1 mm in size, will generally rely on convection as the primary form of heat transfer. In a fractal geometry system, elements spanning these regimes may be provided in a single system.

In one embodiment, the heatsink comprises a heat exchange device with a plurality of heat exchange elements having a fractal variation therebetween. A heat transfer fluid, such as air, water, or another gas or liquid, is induced to flow through the heat exchange device. The heat transfer fluid has turbulent portions. The fractal variation in the plurality of heat exchange elements substantially reduces the narrow band acoustic resonance resulting from fluid flow around the heatsink elements as compared to a heatsink having a linear or Euclidian geometric variation between the plurality heat exchange elements. The turbulent flow also disturbs the stagnant surface boundary layer, leading to more efficient heat transfer, but generally reduced flow rates for the same motive force. Note that, since turbulence dissipates energy, under some conditions, the heat added to the system by inducing the heat transfer fluid flow can be a significant factor.

When a heat transfer fluid (air, gas or liquid) is induced to flow over a surface, there may be turbulence in the fluid. The fractal shape of the heatsink would generally provide a range of physical size parameters, and thus for any given flow rate, would typically induce turbulent flow over some portion of a fractal geometry array. Notably, because the flow for a given heatsink may vary over a range of speeds, and the temperature and viscosity of the fluid varies over a range of conditions, a fractal geometry facilitates optimization over a range of parameters.

In fluid dynamics, turbulence or turbulent flow is a flow regime characterized by chaotic property changes. This includes low momentum diffusion, high momentum convection, and rapid variation of pressure and flow velocity in space and time. See, en.wikipedia.org/wiki/Turbulence; www.scholarpedia.org/article/Turbulence, expressly incorporated herein by reference. Flow in which the kinetic energy dies out due to the action of fluid molecular viscosity is called laminar flow. While there is no theorem relating the non-dimensional Reynolds number (Re) to turbulence, flows at Reynolds numbers larger than 5,000 are typically (but not necessarily) turbulent, while those at low Reynolds numbers usually remain laminar. In Poiseuille flow, for example, turbulence can first be sustained if the Reynolds number is larger than a critical value of about 2,040; moreover, the turbulence is generally interspersed with laminar flow until a larger Reynolds number of about 4,000. In turbulent flow, unsteady vortices appear on many scales and interact with each other. Drag due to boundary layer skin friction increases. The structure and location of boundary layer separation often changes, sometimes resulting in a reduction of overall drag. Although laminar-turbulent transition is not governed by Reynolds number, the same transition occurs if the size of the object is gradually increased, or the viscosity of the fluid is decreased, or if the density of the fluid is increased. Turbulence is characterized by the following features: Irregularity: Turbulent flows are always highly irregular. For this reason, turbulence problems are normally treated statistically rather than deterministically. Turbulent flow is chaotic. However, not all chaotic flows are turbulent. Diffusivity: The readily available supply of energy in turbulent flows tends to accelerate the homogenization (mixing) of fluid mixtures. The characteristic which is responsible for the enhanced mixing and increased rates of mass, momentum and energy transports in a flow is called "diffusivity". Rotationality: Turbulent flows have non-zero vorticity and are characterized by a strong three-dimensional vortex generation mechanism known as vortex stretching. In fluid dynamics, they are essentially vortices subjected to stretching associated with a corresponding increase of the component of vorticity in the stretching direction—due to the conservation of angular momentum. In general, the stretching mechanism implies thinning of the vortices in the direction perpendicular to the stretching direction due to volume conservation of fluid elements. As a result, the radial length scale of the vortices decreases and the larger flow structures break down into smaller structures. The process continues until the small-scale structures are small enough that their kinetic energy can be transformed by the fluid's molecular viscosity into heat, i.e., atomic scale random motion. This is why turbulence is always rotational and three dimensional. Dissipation: To sustain turbulent flow, a persistent source of energy supply is required because turbulence dissipates rapidly as the kinetic energy is converted into internal energy by viscous shear stress. It therefore becomes apparent that, because turbulent flow is chaotic, an optimization of heatsink geometry responsive to chaotic features can achieve efficiencies over a range of operating regimes, and at particular operating regimes.

Turbulence causes the formation of eddies of many different length scales. Most of the kinetic energy of the turbulent motion is contained in the large-scale structures. The energy "cascades" from these large-scale structures to smaller scale structures by an inertial and essentially inviscid mechanism. This process continues, creating smaller and smaller structures which produces a hierarchy of eddies. Eventually this process creates structures that are small enough that molecular diffusion becomes important and viscous dissipation of energy finally takes place. The scale at which this happens is the Kolmogorov length scale.

Via this energy cascade, turbulent flow can be realized as a superposition of a spectrum of flow velocity fluctuations and eddies upon a mean flow. The eddies are loosely defined as coherent patterns of flow velocity, vorticity and pressure. Turbulent flows may be viewed as made of an entire hierarchy of eddies over a wide range of length scales and the hierarchy can be described by the energy spectrum that measures the energy in flow velocity fluctuations for each length scale (wavenumber). The scales in the energy cascade are generally uncontrollable and highly non-symmetric. Nevertheless, based on these length scales these eddies can be divided into three categories.

Integral length scales: Largest scales in the energy spectrum. These eddies obtain energy from the mean flow and also from each other. Thus, these are the energy production eddies which contain most of the energy. They have the large flow velocity fluctuation and are low in frequency. Integral scales are highly anisotropic. The maximum length of these scales is constrained by the characteristic length of the apparatus.

Kolmogorov length scales: Smallest scales in the spectrum that form the viscous sub-layer range. In this range, the energy input from nonlinear interactions and the energy drain from viscous dissipation are in exact balance. The small scales have high frequency, causing turbulence to be locally isotropic and homogeneous.

Taylor microscales: The intermediate scales between the largest and the smallest scales which make the inertial subrange. Taylor microscales are not dissipative scale but pass down the energy from the largest to the smallest. Taylor microscales play a dominant role in energy and momentum transfer in the wavenumber space.

The Russian mathematician Andrey Kolmogorov proposed the first statistical theory of turbulence, based on the aforementioned notion of the energy cascade (an idea originally introduced by Richardson) and the concept of self-similarity (e.g., fractal relationships). For very high Reynolds numbers, the small-scale turbulent motions are statistically isotropic (i.e. no preferential spatial direction could be discerned). In general, the large scales of a flow are not isotropic, since they are determined by the particular geometrical features of the boundaries (the size characterizing the large scales will be denoted as L). Thus, Kolmogorov introduced a second hypothesis: for very high Reynolds numbers the statistics of small scales are universally and uniquely determined by the kinematic viscosity (v) and the rate of energy dissipation (s). With only these two parameters, the unique length (Kolmogorov length scale) that can be formed by dimensional analysis is $$\eta = \left(\frac{v^3}{\varepsilon}\right)^{1/4}.$$

A turbulent flow is characterized by a hierarchy of scales through which the energy cascade takes place. Dissipation of kinetic energy takes place at scales of the order of Kolmogorov length η, while the input of energy into the cascade comes from the decay of the large scales, of order L. These two scales at the extremes of the cascade can differ by several orders of magnitude at high Reynolds numbers. In between there is a range of scales (each one with its own characteristic length r) that has formed at the expense of the energy of the large ones. These scales are very large compared with the Kolmogorov length, but still very small compared with the large scale of the flow (i.e., $\eta \ll r \ll L$). Since eddies in this range are much larger than the dissipative eddies that exist at Kolmogorov scales, kinetic energy is essentially not dissipated in this range, and it is merely transferred to smaller scales until viscous effects become important as the order of the Kolmogorov scale is approached. Within this range inertial effects are still much larger than viscous effects, and it is possible to assume that viscosity does not play a role in their internal dynamics (for this reason this range is called "inertial range"). Kolmogorov theory is at present under revision. The theory implicitly assumes that the turbulence is statistically self-similar at different scales. This essentially means that the statistics are scale-invariant in the inertial range. However, there is evidence that turbulent flows deviate from this idealized behavior. See, Davidson, P. A. (2004). Turbulence: An Introduction for Scientists and Engineers. Oxford University Press. ISBN 978-0-19-852949-1; scholarpedia.org;

G. Falkovich, Scholarpedia, "Cascade and scaling";

Jin, Y.; Uth, M.-F.; Kuznetsov, A. V.; Herwig, H. (2 Feb. 2015). "Numerical investigation of the possibility of macroscopic turbulence in porous media: a direct numerical simulation study". Journal of Fluid Mechanics 766: 76-103. Bibcode:2015JFM . . . 766 . . . 76J. doi:10.1017/jfm.2015.9;

G Falkovich and K. R. Sreenivasan. Lessons from hydrodynamic turbulence, Physics Today, vol. 59, no. 4, pages 43-49 (April 2006);

J. Cardy, G. Falkovich and K. Gawedzki (2008) Non-equilibrium statistical mechanics and turbulence. Cambridge University Press;

P. A. Durbin and B. A. Pettersson Reif. Statistical Theory and Modeling for Turbulent Flows. Johns Wiley & Sons, 2001;

T. Bohr, M. H. Jensen, G. Paladin and A. Vulpiani. Dynamical Systems Approach to Turbulence, Cambridge University Press, 1998;

J. M. McDonough (2007). Introductory Lectures on Turbulence—Physics, Mathematics, and Modeling;

Kolmogorov, Andrey Nikolaevich (1941). "The local structure of turbulence in incompressible viscous fluid for very large Reynolds numbers". Proceedings of the USSR Academy of Sciences (in Russian) 30: 299-303., translated into English by V. Levin: Kolmogorov, Andrey Nikolaevich (Jul. 8, 1991). Proceedings of the Royal Society A 434 (1991): 9-13. Bibcode:1991RSPSA.434 . . . 9K. doi: 10.1098/rspa.1991.0075;

Kolmogorov, Andrey Nikolaevich (1941). "Dissipation of Energy in the Locally Isotropic Turbulence". Proceedings of the USSR Academy of Sciences (in Russian) 32: 16-18, translated into English by Kolmogorov, Andrey Nikolaevich (Jul. 8, 1991). Proceedings of the Royal Society A 434 (1980): 15-17. Bibcode:1991RSPSA.434 . . . 15K. doi: 10.1098/rspa.1991.0076;

G. K. Batchelor, The theory of homogeneous turbulence. Cambridge University Press, 1953.

Therefore, the efficiency of heat transfer may be increased as compared to a heat exchange device having a linear or Euclidian geometric variation between several heat exchange elements, at least over certain regimes of operation.

The heat exchange device may include a highly conductive substance whose heat conductivity exceeds 850 W/(m·K). Examples of such superconductors include graphene, diamond, and diamond-like coatings. Alternatively, the heat exchange device may include carbon nanotubes. At such high thermal conductivities, phonon heat transport may be at play.

Various variations on this heatsink will be apparent to skilled persons in the art. For example, the heatsink could include a heat transfer surface that is connected to the heat exchange device and is designed to accept a solid to be cooled. Alternatively, there could be a connector that is designed to connect with a solid to be cooled in at least one point. In another embodiment, there are at least three connectors serving to keep the solid and the heatsink in a fixed position relative to one another. Various connectors will be apparent to persons skilled in the art. For example, the connector could be a point connector, a bus, a wire, a planar connector or a three-dimensional connector. In another embodiment, the heatsink has an aperture or void in the center thereof designed to accept a solid to be cooled. The heatsink may also be integral to the heat source, or attached by other means.

This heatsink is typically intended to be used to cool objects, and may be part of a passive or active system. Modern three-dimensional laser and liquid printers can create objects such as the heatsinks described herein with a resolution of features on the order of about 16 μm, making it feasible for those of skilled in the art to use such fabrication technologies to produce objects with a size below 25 cm. Alternatively, larger heatsinks, such as car radiators, can be manufactured in a traditional manner, designed with an architecture of elements having a fractal configuration. For example, a liquid-to-gas heat exchanger (radiator) may be provided in which segments of fluid flow conduit have a fractal relationship over three levels of recursion, i.e., paths with an average of at least two branches. Other fractal design concepts may be applied concurrently, as may be appropriate.

Yet another embodiment of the invention involves a method of cooling a solid by connecting the solid with a heatsink. The heatsink comprises a heat exchange device having a plurality of heat exchange elements having a fractal variation therebetween. A heat transfer fluid having turbulent portions is induced to flow with respect to the plurality of heat exchange elements. The fractal variation in the plurality of heat exchange elements serves to substantially reduce narrow band resonance as compared to a corresponding heat exchange device having a linear or Euclidean geometric variation between a plurality of heat exchange elements.

A preferred embodiment provides a surface of a solid heatsink, e.g., an internal or external surface, having fluid thermodynamical properties adapted to generate an asymmetric pattern of vortices over the surface over a range of fluid flow rates. For example, the range may comprise a range of natural convective fluid flow rates arising from use of the heatsink to cool a heat-emissive object. The range may also comprise a range of flow rates arising from a forced convective flow (e.g., a fan) over the heatsink.

The heatsink may cool an unconstrained or uncontained fluid, generally over an external surface of a heatsink, or a constrained or contained fluid, generally within an internal surface of a heatsink.

BRIEF DESCRIPTION OF THE DRAWINGS

FIG. 10 illustrates a fractal heatsink that is an exemplary embodiment of the invention. In this embodiment, the heatsink is based on five iterations of a Sierpinski tetrahedron.

FIG. 11 illustrates a fractal heatsink that is an exemplary embodiment of the invention. In this embodiment, the heatsink is based on a Dodecaedron fractal.

FIG. 12 illustrates a fractal heatsink that is an exemplary embodiment of the invention. In this embodiment, the heatsink is based on a Icosahedron flake.

DETAILED DESCRIPTION OF THE PREFERRED EMBODIMENTS

Figure 2:
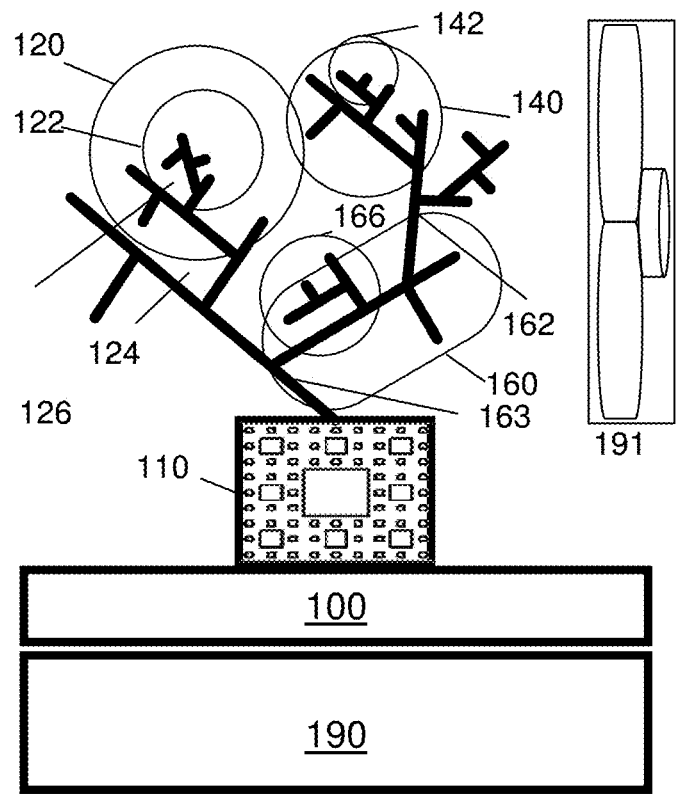
FIG. 2 illustrates a fractal heatsink that is an exemplary embodiment of the invention. In this embodiment, the heatsink is placed adjacent to the object to be cooled.

FIG. 2 illustrates a heatsink implementing a first embodiment of this invention. Note that the illustration is in two dimensions, but a three-dimensional embodiment is both possible and preferred. There is a heat transfer surface 100 that allows the heatsink to rest comfortably on a surface, such as the solid to be cooled 190. In the illustrated embodiment, the heat transfer surface 100 is roughly planar, having a closed Euclidian cross-section on the bottom. However, it might also have another shape, for example if the solid to be cooled does not have a planar face. A fractal-shaped heat exchange device begins at point 110. Note that the heatsink has three branches leaving from point 110—branch 120, branch 140, and branch 160. Also note that the branch structure initiating from point 110 is nearly identical to that at point 122 and 142, even though only point 110 is a true starting point. Thus, the fractal property of self-similarity is present. We call the structure that begins at point 110 the "first motif," the structure from point 122 the "second motif," and the structure that begins from point 142 the "third motif." Note that, in the embodiment illustrated in FIG. 2, the replication from first to second motif and from second to third motif involves a linear displacement (upward) and a change of scale. In branches not going in the same direction as the prior branch, there is also a rotation. Under the limitations for ideal fractals, the second motif and third motif are a smaller, similar copy of the first motif. However, due to the limitations imposed by human-made structures and machines, the fractals designed here are generally finite and the second motif will thus be an inexact copy of the first motif, i.e., if there are N levels starting from the first motif, the second motif level will have N−1 levels, if N is very large, the difference is insignificant. In other words, the self-similarity element required in fractals is not preserved perfectly in the preferred designs due to the limitations of available machinery, other feasibility constraints, and various design issues. In addition, the benefits are achieved without requiring fractal relationships over more than a few "orders" of magnitude (iterations of the fractal recursive algorithm). For example, in the embodiment illustrated in FIG. 2, there are no continuing branch divisions and iterations at point 162, even though an ideal fractal would have them. In an ideal fractal, there would be an infinite number of sub-branches from 110, 122, and 142. However, an imperfect fractal shape, as illustrated in FIG. 2, will serve the purposes of this invention.

The fractal heatsink has a much larger surface area than the heat transfer surface alone, or a regular array of heatsink because all of the "branches" and "leaves" of the fern-like fractal shape serve to increase the surface area. In addition, if a heat transfer fluid is induced to flow above the heat transfer surface 100, the turbulent portions of the heat transfer fluid near the surface will be increased by the textures inherent in the fractal variation in the heat exchange element 110. Because the fractal patterns is itself non-identically repeating within the fractal design, this will serve to substantially reduce narrow band acoustic resonance as compared to a corresponding heat exchange device having a repeating design, e.g., a linear or geometric variation between several heat exchange elements, thereby further aiding in the heat transfer process.

In a preferred embodiment, the heat transfer surface 100 and the roughly fractal-shaped heat exchange element 110 are all made out of an efficient heat conductor, such as copper or aluminum, or more preferably, having a portion whose heat conductivity exceeds 850 W/(m*K), such as graphene with a heat conductivity of between 4840 and 5300 W/(m*K) or diamond with a heat conductivity between 900 and 2320 W/(m*K). This would allow heat to quickly enter the heatsink from the solid and for heat to quickly exit the heatsink through the branches and leaves of the fern-like fractal 110. In another embodiment, the heatsink is formed, at least in part, of carbon nanotubes, which display anisotropic heat conduction, with an efficient heat transfer along the long axis of the tube. Carbon nanotubes are submicroscopic hollow tubes made of a chicken-wire-like or lattice of carbon atoms. These tubes have a diameter of just a few nanometers and are highly heat conductive, transferring heat much faster than diamond, and in some cases comparable to graphene. See web.mit.edu/press/2010/thermopower-waves.html (last accessed Apr. 15, 2010) incorporated herein by reference.

Also note that this exemplary embodiment provides a plethora of openings, e.g., 124 and 126, between the branches or fractal subelements to ensure that all of the branches are exposed to the surrounding air, gas or liquid and to allow the heat to escape from the heatsink into the surroundings. In one embodiment of the invention, at least two of these openings are congruent, as are openings 124 and 126 illustrated here. An embodiment of the invention allows the openings to be filled with the air or liquid from the surrounding medium. Due to the limitation imposed by the solid's flat shape, it is not possible to increase the exposure of the fern-like fractal to the solid. However, the air or liquid outside of the solid are perfect for the fractal's exposure.

Under the phonon model of heat exchange, applicable to carbon nanotubes, graphene materials, and perhaps others, the fractal shape is advantageous to ensure the escape of the phonons into the surrounding fluid medium because the fractal configuration may avoid peaked internal reflection of waves, and provide high surface exposure to the fluid heat transfer medium. Skilled persons in the art will realize that this could be achieved through many known structures. For example, graphene, which is one-atom-thick carbon and highly heat conductive, would be an advantageous material to use to build a 2D implementation of the fractal heatsink herein described.

When a turbulently flowing fluid passes around an obstacle, concave regions or cavities in the obstacle create pockets of separated flow which generates self-sustaining oscillations and acoustic resonance. Convex regions may also be provided. These regions may be provided in a fractal arrangement. In this aspect of the technology, fractal is meant to signify self-similar but with differences in scale and optionally another attribute. The regions may produce substantially reduced narrow band acoustic resonance as compared to regularly spaced and arranged disruptions in the flow pattern. Likewise, the presence of disruptions disturbs the surface layer and may enhance convective heat transfer.

Figure 3:
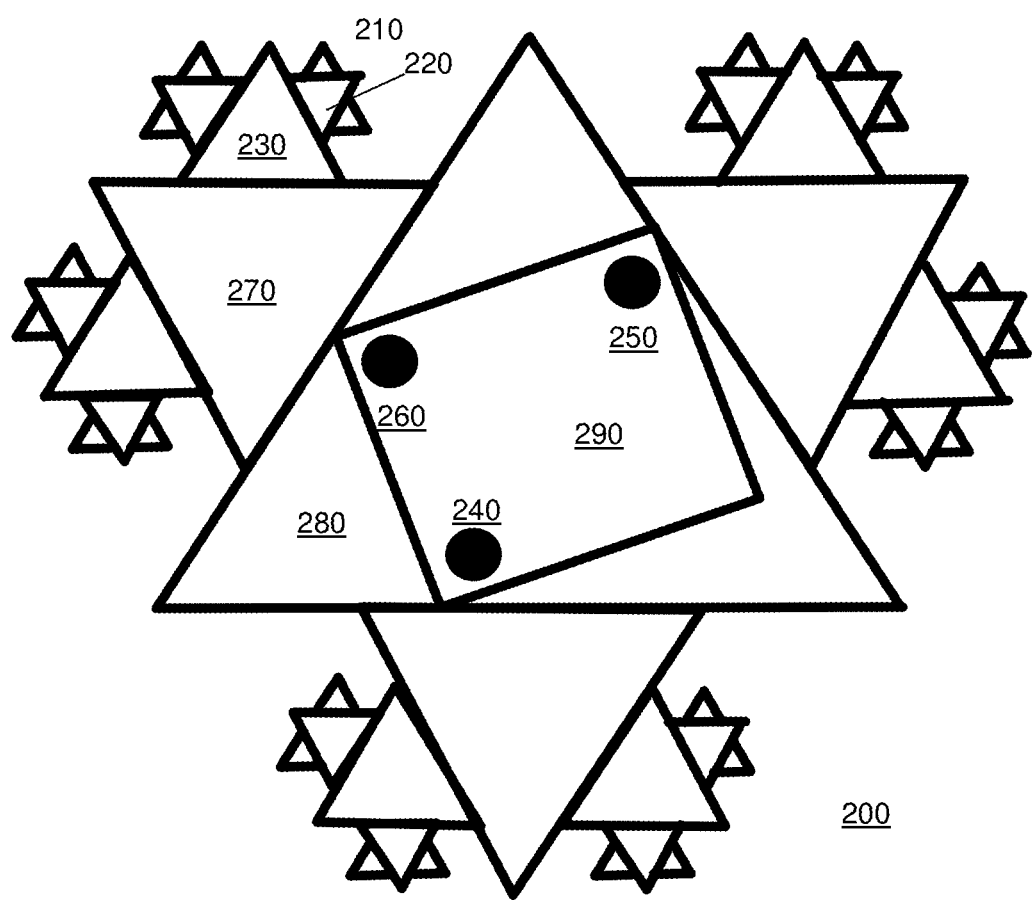
FIG. 3 illustrates a fractal heatsink that is an exemplary embodiment of the invention. In this embodiment, the heatsink is placed either adjacent to or surrounding the object to be cooled.

FIG. 3 illustrates another embodiment of the invention. A solid to be cooled that has an arbitrary shape 290 is located inside (illustrated) or outside (not illustrated) a two-dimensional or three-dimensional roughly fractal shaped 200 heatsink. In one embodiment, the heatsink 210 has an aperture 270 designed to hold the solid. Note that, as in FIG. 2, the fractal heat exchange element has multiple motifs, starting with the large triangle at 280, to progressively smaller triangles at 270, 230, 220 and 210. However, note that the fractal does not keep extending infinitely and there are no triangles smaller than the one at 210. In other words, the fractal heatsink 200 has multiple recursive fractal iterations 210, 220, 230, 270 and 280, but the fractal iterations stop at level 210 for simplicity of design and manufacturability. Also note that the fractal submotifs 270, 230, 220 and 210 are of different dimensional sizes from the original fractal motif 280 and protrude from a larger fractal shape. Here, the first motif is a large triangle, and the latter motifs are smaller triangles, which involve a rotation, linear displacement, and change of scale of the prior motif. In one embodiment, the fractal shape has some apertures in it (illustrated in FIG. 8A, Sierpinski carpet and FIG. 15, Jerusalem cube, for example) to allow the solid to be cooled to connect with other elements. Also, the solid to be cooled is connected to the fractal shape at point connector 240 and through bus wires at 250 and 260. The solid should be connected to the fractal heatsink in at least one point, either through a point connection, a bus wire connection, or some other connection. If it is desired that the solid be fixed inside the heatsink, there may be at least three connection points, as illustrated. However, only one connection point is necessary for conduction between the solid to be cooled and the heatsink. Preferably, the point or bus wire connection is built using a strong heat conductor, such as carbon nanotubes or a diamond-like coating.

Figure 1:
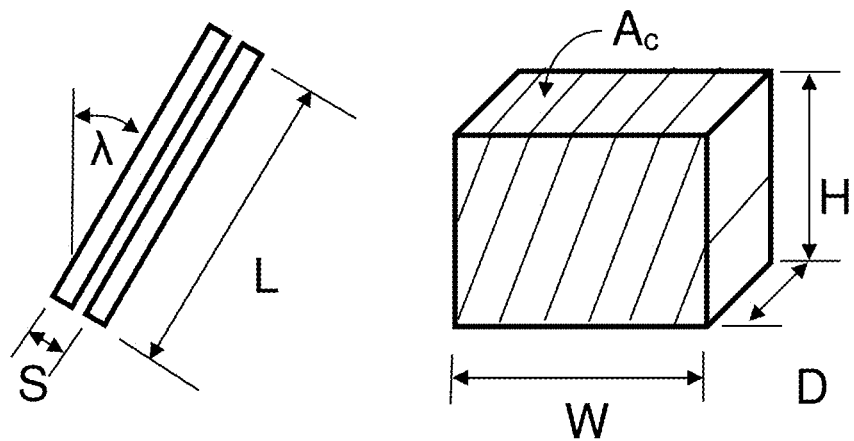
FIG. 1 shows a set of governing equations for a parallel plate heatsink.

Note that, as in FIG. 1, the fractal structure 210 in FIG. 2 has multiple concave regions or cavities. When a turbulently flowing fluid passes around this fractal heatsink, the concave regions or cavities substantially reduce the narrow band acoustic resonance as compared to a flat or Euclidian structure. This allows for more energy to be available to for heat transfer.

In yet another embodiment of the invention, the heatsink 200 in FIG. 3 could be constructed without the connections at points 240, 250, and 260. In one embodiment, a liquid or gas would fill the aforementioned aperture (not shown) with the intent that the liquid or gas surround the solid to be cooled, hold it in place, or suspend it. Preferably, the liquid or gas surrounding the solid would conduct heat from the solid to the heatsink, which would then cause the heat to exit.

Figure 4:
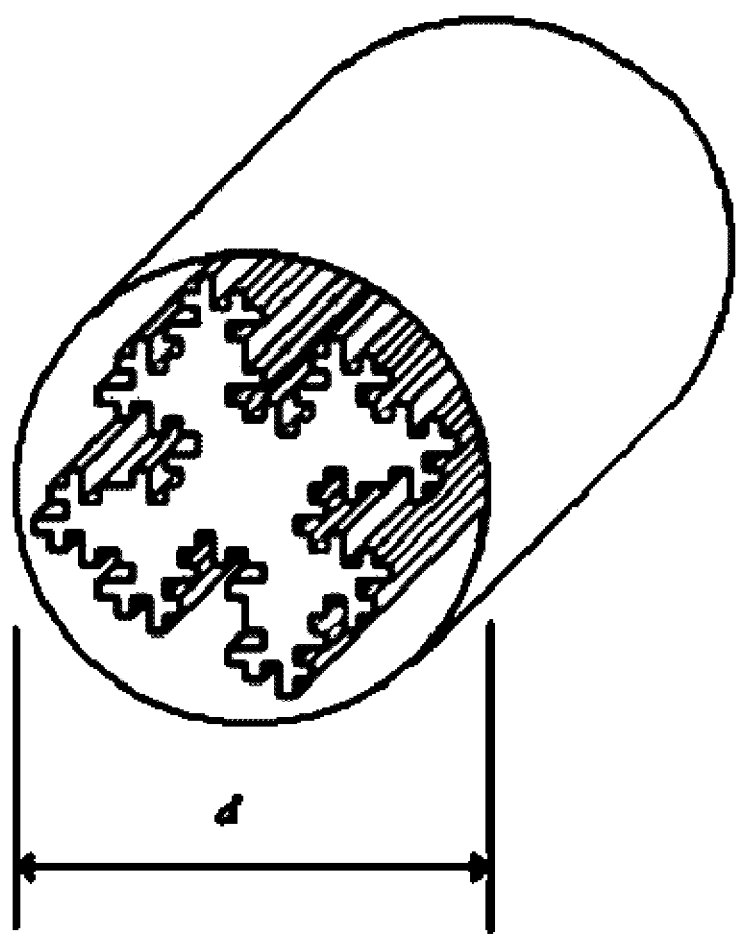
FIG. 4 illustrates a fractal heatsink that is an exemplary embodiment of the invention. In this embodiment, the heatsink is based on a Quadratic Koch Island.

In another embodiment of the invention, the heatsink comprises a heat exchange device which is structurally configured based on a Quadratic Koch Island as illustrated in FIG. 4.

Figure 5A:
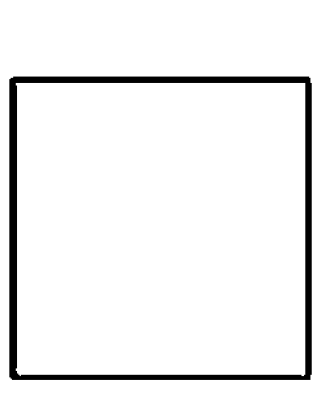
FIG. 5A illustrates the basis for the Quadratic Koch Island.
Figure 5B:
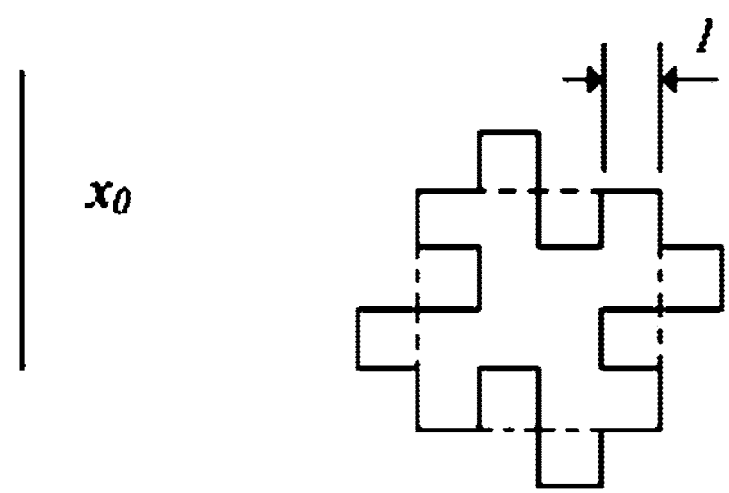
FIG. 5B illustrates a Quadratic Koch Island obtained after application of one iteration.
Figure 5C:
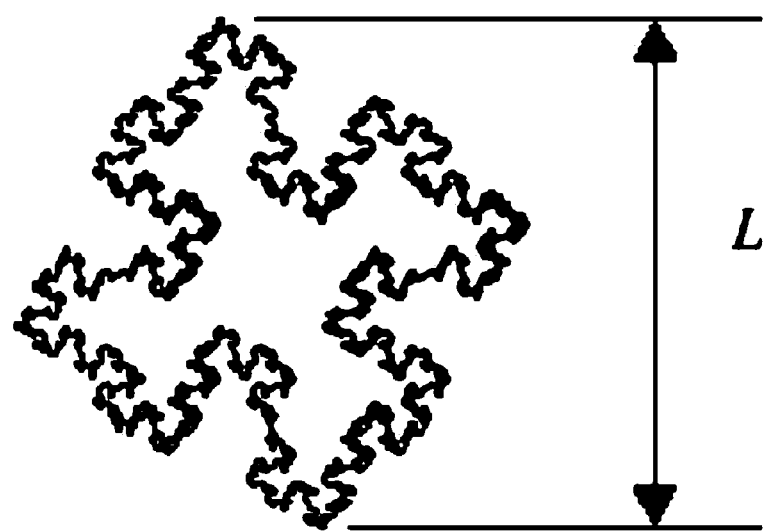
FIG. 5C illustrates a Quadratic Koch Island obtained after application of several iterations.

FIG. 5A illustrates a square with dimension $x_0$ that forms the basis for the Quadratic Koch Island. FIG. 5B illustrates a Quadratic Koch Island obtained after application of one fractal on the square. The fractal with section lengths of l is applied to each side of the square in the first iteration. Similarly, after several such iterations, a Quadratic Koch Island as illustrated in FIG. 5C may be obtained.

Figure 6:
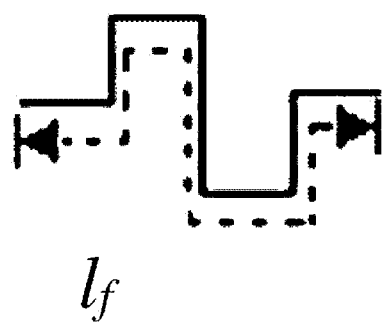
FIG. 6 illustrates the total length of all the fractal segments of a Quadratic Koch Island.

FIG. 6 illustrates the length of the fractal $l_f$ which is the total length of all the fractal segments. The length of each fractal section, l(n), decreases with each iteration of the fractal. The fractal section length is described by eq. 7.

$$l(n) = (1/4)^n x_0 \qquad (7)$$

where,
$x_0$ is the length of the side of the original square,
n is the number of iterations As can be seen from eq. 7, the fractal section length decreases after each iteration. When the number of iterations becomes increasingly large, the section length tends towards being negligible.

Further, it may be mathematically shown that the overall length L of the fractal may be obtained from eq. 8.

$$L(n) = x_0 \left(1 + \frac{2}{3}\left(1 - \frac{1}{4^n}\right)\right) \qquad (8)$$

where,
$x_0$ is the length of the side of the original square,
n is the number of iterations Similarly, it may be shown that the circumference C of the Quadratic Koch Island can be obtained from eq. 9.

$$C = 4(2^n x_0) \qquad (9)$$

where,
$x_0$ is the length of the side of the original square,
n is the number of iterations It is evident that with each iteration, the circumference C increases. However, the cross-sectional area remains constant at $x_0^2$ since when a fractal area is added the same area is subtracted elsewhere.

In one embodiment, the number of iterations corresponding to the Quadratic Koch Island may be greater than 5. Consequently, the heat exchange device functions as a compact heat exchanger. In other words, the heat exchange device has a large heat transfer area per unit exchanger volume. As a result, several advantages are obtained such as, but not limited to, reduction in space, weight, power requirements and costs. In another embodiment, the number of iterations corresponding to the Quadratic Koch Island may be less than or equal to 5. Consequently, the heat exchange device may function as a non-compact heat exchanger.

It may be shown with heat transfer analysis that heat transfer and heat transfer coefficient increase independently of each other with every application of the fractal. Further, the increase may be double, or greater, with every fractal iteration. In general, the increase in heat transfer follows a trend of $2^n$. Moreover, pumping power increases at almost one and a half the rate. Pumping power is the power needed to pump the heat transfer fluid through the heat exchange device.

Figure 7A:
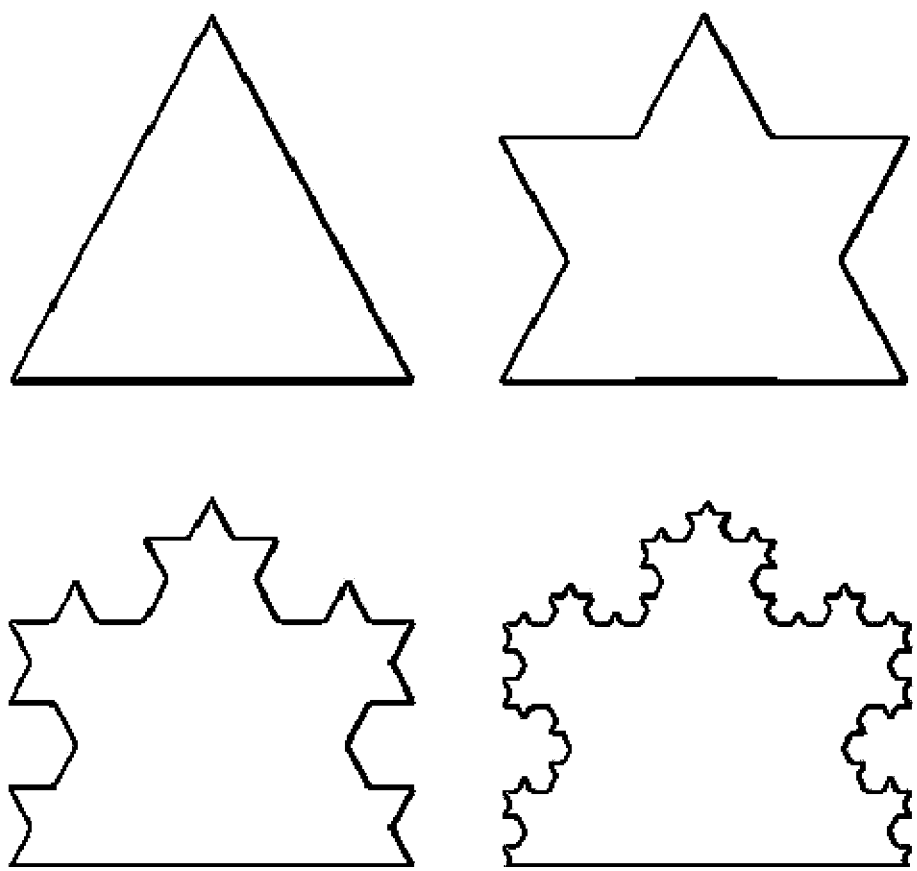
FIG. 7A illustrates a fractal heatsink that is an exemplary embodiment of the invention. In this embodiment, the heatsink is based on a modified Koch Snowflake.
Figure 7B:
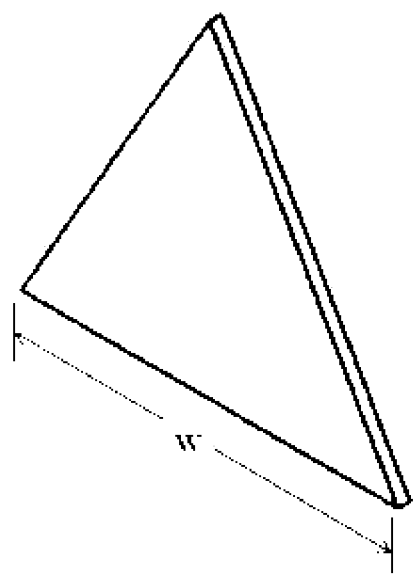
FIG. 7B illustrates the basis for generating the modified Snowflake.

In yet another embodiment of the invention, the heatsink comprises a heat exchange device which is structurally configured based on a modified Koch Snowflake as illustrated in FIG. 7A. The basis for generating the modified Snowflake is an equilateral triangle of width w as illustrated in FIG. 7B. In the first iteration, two smaller equilateral triangles of width ⅓ of the base width w are added onto two sides of the base triangle. Similarly, by applying a second and a third iteration, the modified Koch Snowflakes as illustrated in FIG. 7A may be obtained.

The surface area, $A_s(n)$, of the modified Koch Snowflake may be obtained from eq. 10.

$$A_s(n) = 2\left(wl + \frac{\sqrt{3}}{4}w^2\right) + \sum_1^n \left[\left(\frac{w}{3^n}\right)^2\left(\frac{\sqrt{3}}{2}\right) + \left(\frac{w}{3^n}\right)t\right]2^{2n-1} \qquad (10)$$

where,
w is the width of the base triangle
n is the number of iterations
t is the thickness of the modified Koch Snowflake It is evident that the surface area of the modified Koch Snowflake increases with each iteration. More specifically, it may be observed that after 5 iterations there is an increase in surface area of about 58%.

Further, the mass of the modified Koch Snowflake may be obtained using eq. 11.

$$m(n) = \left\{\frac{\sqrt{3}}{4}w^2 = \sum_1^n \left[\left(\frac{w}{3^n}\right)^2\left(\frac{\sqrt{3}}{4}\right)\right]2^{2n01}\right\}\rho t \qquad (11)$$

where,
w is the width of the base triangle
n is the number of iterations
t is the thickness of the modified Koch Snowflake
$\rho$ is the density of the material making up the modified Koch Snowflake It may be observed that the change in surface area with respect to the baseline case (i.e., n=0) is a function of width (w) and thickness (t). However, the change in mass with respect to the baseline is dependent on the fractal geometry chosen. The mass of the modified Koch Snowflake increases with each iteration. However, it converges to a maximum value of mass increase of approximately 40%.

A heat transfer effectiveness (ε) of the modified Koch Snowflake may be defined as the ratio of heat transfer achieved to heat transfer that would occur if the modified Koch Snowflake was not present. E may be calculated from eq. 13.

$$\varepsilon = \frac{Q_c}{hA_b(T_b - T_\infty)} \tag{13}$$

where, $Q$ is the heat rate h is the heat transfer co-efficient

A is the area

T is the temperature

Further, a heat transfer efficiency (η) of the modified Koch Snowflake may be defined as the ratio of heat transfer achieved to the heat transfer that would occur if the entire modified Koch Snowflake was at the base temperature. η may be calculated from eq. 12.

$$\eta = \frac{Q_c}{hA_s(T_b - T_\infty)} \tag{12}$$

where, $Q$ is the heat rate h is the heat transfer co-efficient

A is the area

T is the temperature

The heat transfer effectiveness (ε) increases with each iteration. In an embodiment, the modified Koch Snowflake corresponding to three iterations may be used to form the heat exchange device. Accordingly, in this case, the heat transfer effectiveness (ε) may increase by up to 44.8%. Further, the increase in heat transfer effectiveness (ε) per mass may be up to 6%. In one embodiment, the material used to make the modified Koch Snowflake may be aluminum.

Consequently, heat transfer effectiveness (ε) per mass of approximately two times larger than that obtained using copper may be achieved.

Further, the heat transfer effectiveness (ε) per mass depends on the thickness of the modified Koch Snowflake. In an embodiment, the ratio of width (w) to thickness (t) corresponding to the modified Koch Snowflake may be 8. Accordingly, an increase in heat transfer effectiveness (ε) per mass of up to 303% may be achieved at the fourth iteration.

Figure 8A:
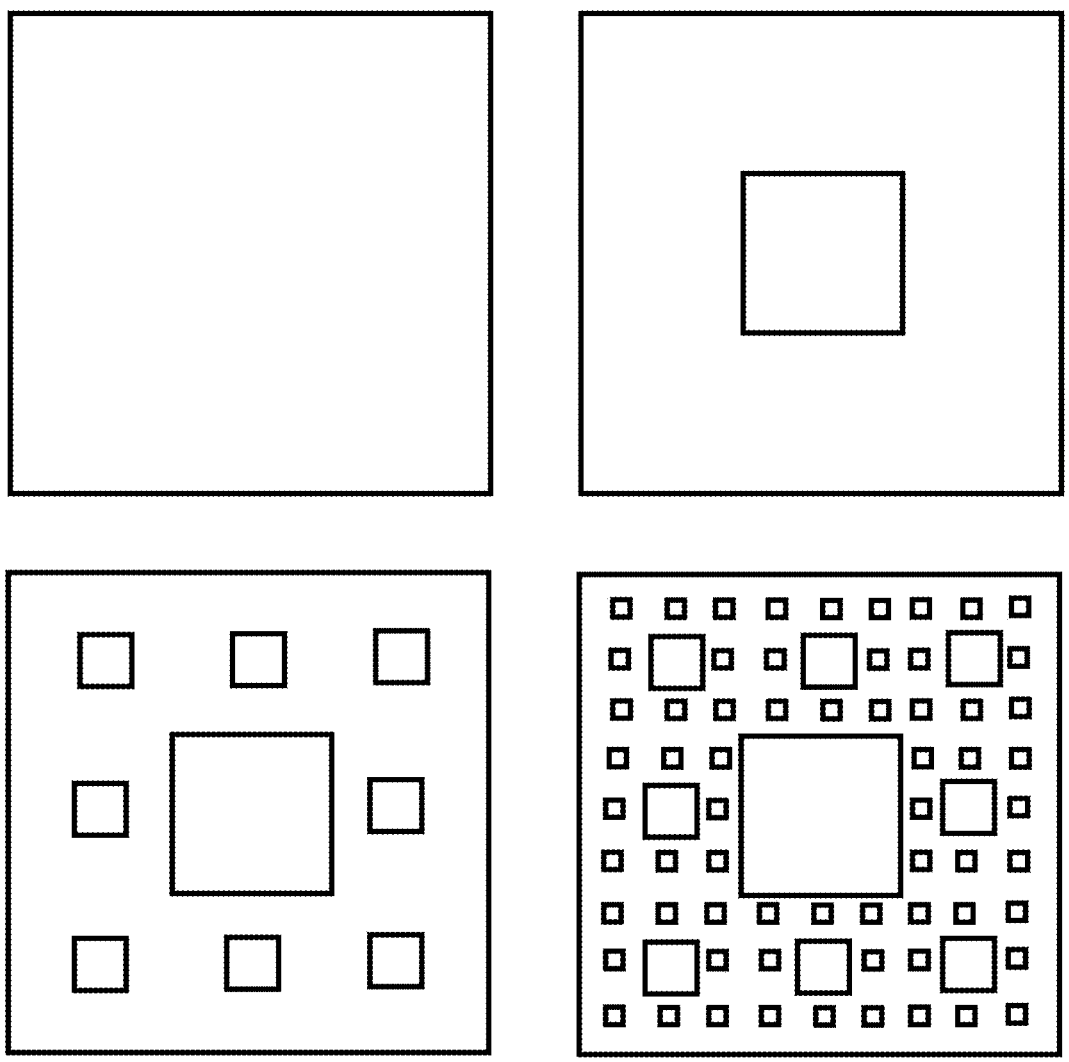
FIG. 8A illustrates a fractal heatsink that is an exemplary embodiment of the invention. In this embodiment, the heatsink is based on a Sierpinski Carpet.
Figure 8B:
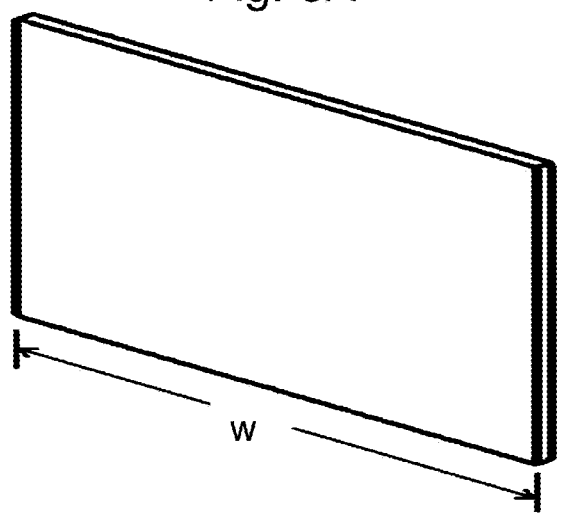
FIG. 8B illustrates the basis for generating the Sierpinski Carpet.

In yet another embodiment of the invention, the heatsink comprises a heat exchange device which is structurally configured based on a Sierpinski Carpet as illustrated in FIG. 8A. The Sierpinski Carpet is formed by iteratively removing material from a base geometry such as, but not limited to, a square as illustrated in FIG. 8B. In the first iteration, a square with ⅓ of the base width (w) is removed. Similarly, by performing second and third iterations, the Sierpinski Carpets as illustrated in FIG. 8A may be obtained.

The surface area, $A_s(n)$, of the Sierpinski Carpet may be obtained from eq. 13.

$$A_s(n) = 2w^2 + 3wt - \sum_1^n 8^{n-1}\left[2\left(\frac{w}{3^n}\right)^2 - 4\left(\frac{w}{3^n}\right)t\right] \tag{13}$$

where, w is the width of the base square n is the number of iterations t is the thickness of the Sierpinski Carpet Starting from n=0, with each subsequent iteration, the surface area of the Sierpinski carpet initially reduces before reaching a minimum. However, after reaching the minimum, the surface area increases with each subsequent iteration. For example, at a width (w) of 0.0508 m an increase in surface area of 117% may be obtained after five iterations. Similarly, at a width (w) of 0.0254 m, a surface area increase of 265% may be obtained after five iterations.

Further, the mass of the Sierpinski Carpet may be obtained using eq. 14.

$$m(n) = \left\{w^2 - \sum_1^8\left[8^{n-1}\left(\frac{w}{3^n}\right)^2\right]\right\}\rho t \tag{14}$$

where, w is the width of the base square n is the number of iterations t is the thickness of the Sierpinski carpet ρ is the density of the material making up the Sierpinski carpet It may be seen from eq. 11 that with each iteration, the mass of the Sierpinski carpet decreases. For example, after five iterations, there is a reduction of 45% of mass of the Sierpinski carpet.

The heat transfer effectiveness (ε) corresponding to the Sierpinski carpet increases with each iteration. In an embodiment, the Sierpinski carpet corresponding to three iterations may be used to form the heat exchange device. Accordingly, in this case, the heat transfer effectiveness (ε) may increase by up to 11.4%. Further, the increase in heat transfer effectiveness (ε) per mass corresponding to the Sierpinski carpet may be up to 59%. In one embodiment, the material used to make the Sierpinski carpet may be aluminum. Consequently, heat transfer effectiveness (ε) per mass of approximately two times larger than that obtained using copper may be achieved.

Further, the heat transfer effectiveness (ε) per mass corresponding to the Sierpinski carpet depends on the thickness of the corresponding to the Sierpinski carpet. In an embodiment, the ratio of width (w) to thickness (t) corresponding to the corresponding to the Sierpinski carpet may be 8. Accordingly, an increase in heat transfer effectiveness (ε) per mass of up to 303% may be achieved at the fourth iteration.

In other embodiments, the heatsink may comprise a heat exchange device which is structurally configured based on, but not limited to, one or more fractals selected from the group comprising:

A "scale 2" and "scale 3" Mandelbox

Sierpinski tetrahedron

Fractal pyramid

Dodecahedron fractal 3D quadratic Koch surface (type 1)

3D quadratic Koch surface (type 2)

Jerusalem cube

Figure 9:
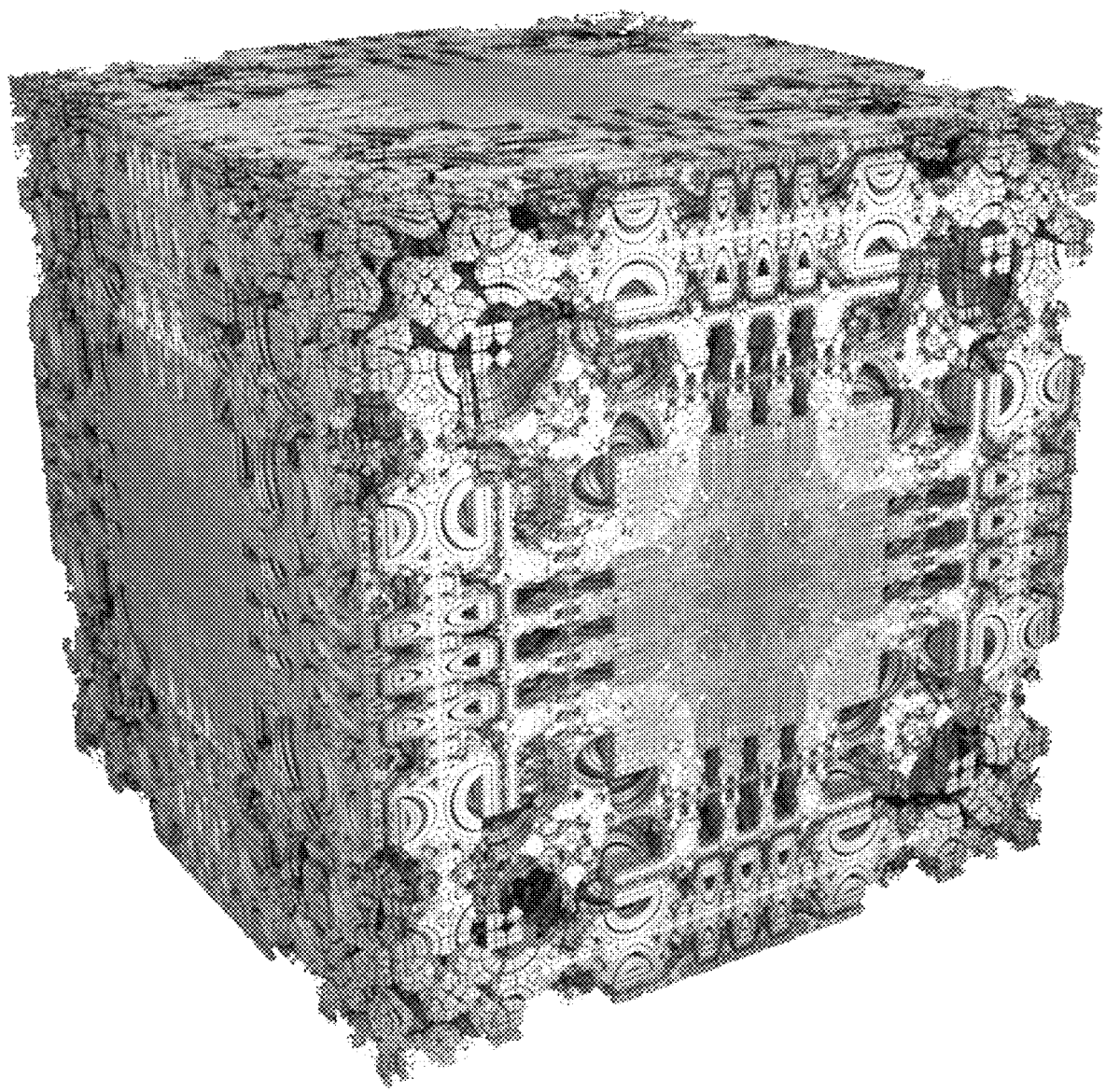
FIG. 9 illustrates a fractal heatsink that is an exemplary embodiment of the invention. In this embodiment, the heatsink is based on a Mandelbox.

Icosahedron fractal
Octahedron fractal
Von Koch surface
Menger sponge
3D H-fractal
Mandelbulb In accordance with an embodiment, the heatsink may comprise a heat exchange device which is structurally configured based on a Mandelbox as exemplarily illustrated in FIG. 9. A Mandelbox is a box-like fractal object that has similar properties as that of the Mandelbrot set. It may be considered as a map of continuous, locally shape preserving *Julia* sets. Accordingly, the Mandelbox varies at different locations, since each area uses a *Julia* set fractal with a unique formula. The Mandelbox may be obtained by applying eq. 15 repeatedly to every point in space. That point v is part of the Mandelbox if it does not escape to infinity.

$$v = s*\text{ballFold}(r, f*\text{boxFold}(v)) + c \qquad (15)$$

where boxFold(v) means for each axis a:
if v[a]>1 v[a]=2−v[a]
else if v[a]<−1 v[a]=−2−v[a]
and ballFold(r, v) means for v's magnitude m:
if m<r m=m/r²
else if m<1 m=1/m In an instance, using the values of s=2, r=0.5 and f=1 in eq.12, the standard Mandelbox may be obtained.

In accordance with another embodiment, the heatsink may comprise a heat exchange device which is structurally configured based on a Sierpinski tetrahedron. The Sierpinski tetrahedron, also called as tetrix, is a three-dimensional analogue of the Sierpinski triangle. The Sierpinski tetrahedron may be formed by repeatedly shrinking a regular tetrahedron to one half its original height, putting together four copies of this tetrahedron with corners touching, and then repeating the process. This is illustrated in FIG. 10 for the first four iterations. The Sierpinski tetrahedron constructed from an initial tetrahedron of side-length L has the property that the total surface area remains constant with each iteration.

The initial surface area of the (iteration-0) tetrahedron of side-length L is $L^2\sqrt{3}$. At the next iteration, the side-length is halved and there are 4 such smaller tetrahedra. Therefore, the total surface area after the first iteration may be calculated by eq. 16.

$$4\left(\left(\frac{L}{2}\right)^2\sqrt{3}\right) = 4\frac{L^2}{4}\sqrt{3} = L^2\sqrt{3} \qquad (16)$$

This remains the case after each iteration. Though the surface area of each subsequent tetrahedron is ¼ that of the tetrahedron in the previous iteration, there are 4 times as many—thus maintaining a constant total surface area. However, the total enclosed volume of the Sierpinski tetrahedron decreases geometrically, with a factor of 0.5, with each iteration and asymptotically approaches 0 as the number of iterations increases.

In accordance with another embodiment, the heatsink may comprise a heat exchange device which is structurally configured based on a dodecaedron fractal. The dodecahedron fractal, also called as dodecahedron flake, may be formed by successive flakes of twenty regular dodecahedrons, as exemplarily illustrated in FIG. 11 for second iteration. Each flake is formed by placing a dodecahedron scaled by $1/(2+\varphi)$ in each corner, wherein $\varphi=(1+\sqrt{5})/2$.

In accordance with another embodiment, the heatsink may comprise a heat exchange device which is structurally configured based on an icosahedron flake, also called as a Sierpinski icosahedron. The icosahedron flake may be formed by successive flakes of twelve regular icosahedrons, as exemplarily illustrated in FIG. 12 for third iteration. Each flake may be formed by placing an icosahedron scaled by $1/(2+\varphi)$ in each corner, wherein $\varphi=(1+\sqrt{5})/2$.

Figure 13:
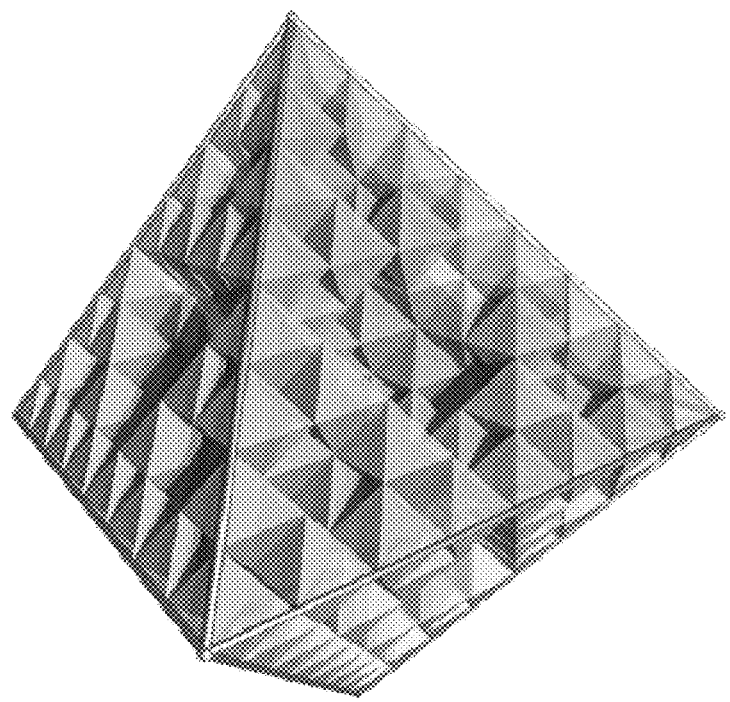
FIG. 13 illustrates a fractal heatsink that is an exemplary embodiment of the invention. In this embodiment, the heatsink is based on an Octahedron flake.

In accordance with another embodiment, the heatsink may comprise a heat exchange device which is structurally configured based on an octahedron flake. The octahedron flake, or Sierpinski octahedron, may be formed by successive flakes of six regular octahedrons, as exemplarily illustrated in FIG. 13 for third iteration. Each flake may be formed by placing an octahedron scaled by ½ in each corner.

Figure 14:
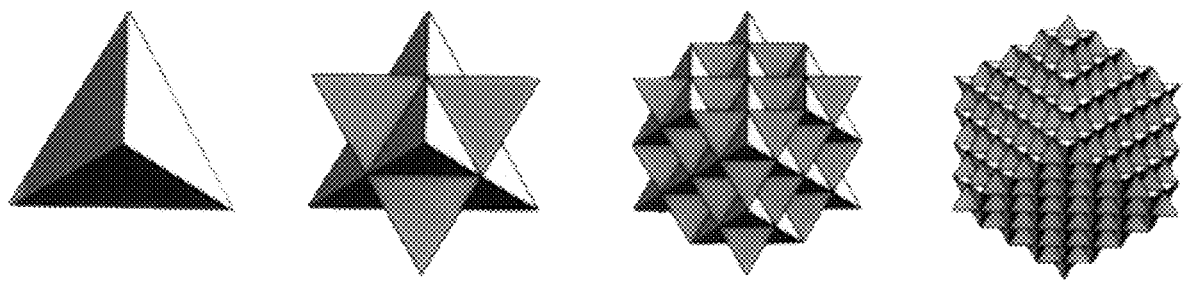
FIG. 14 illustrates a fractal heatsink that is an exemplary embodiment of the invention. In this embodiment, the heatsink is based on a 3D Quadratic Koch.

In accordance with another embodiment, the heatsink may comprise a heat exchange device which is structurally configured based on a 3D Quadratic Koch. As exemplarily illustrated in FIG. 14, the 3D Quadratic Koch may be obtained by growing a scaled down version of a triangular pyramid onto the faces of the larger triangular pyramid with each iteration. FIG. 14 illustrates the first four iterations.

Figure 15:
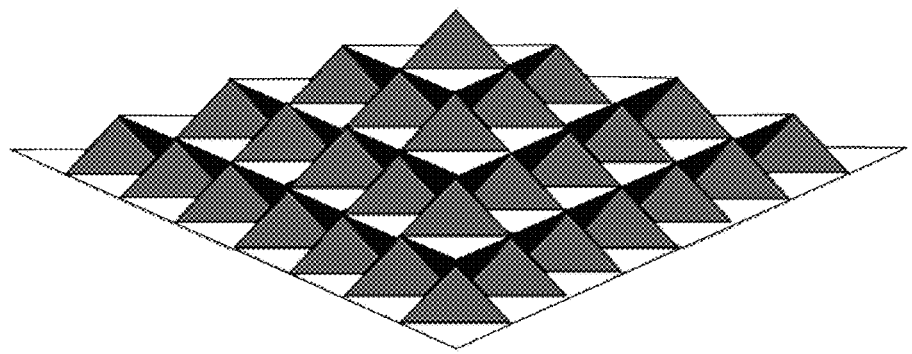
FIG. 15 illustrates a fractal heatsink that is an exemplary embodiment of the invention. In this embodiment, the heatsink is based on a von Koch surface.

In accordance with another embodiment, the heatsink may comprise a heat exchange device which is structurally configured based on a von Koch surface, as exemplarily illustrated in FIG. 15. The von Koch surface may be constructed by starting from an equilateral triangular surface. In the first iteration, the midpoints of each side of the equilateral triangular surface are joined together to form an equilateral triangular base of a hollow triangular pyramid. This process is repeated with each iteration.

Figure 16:
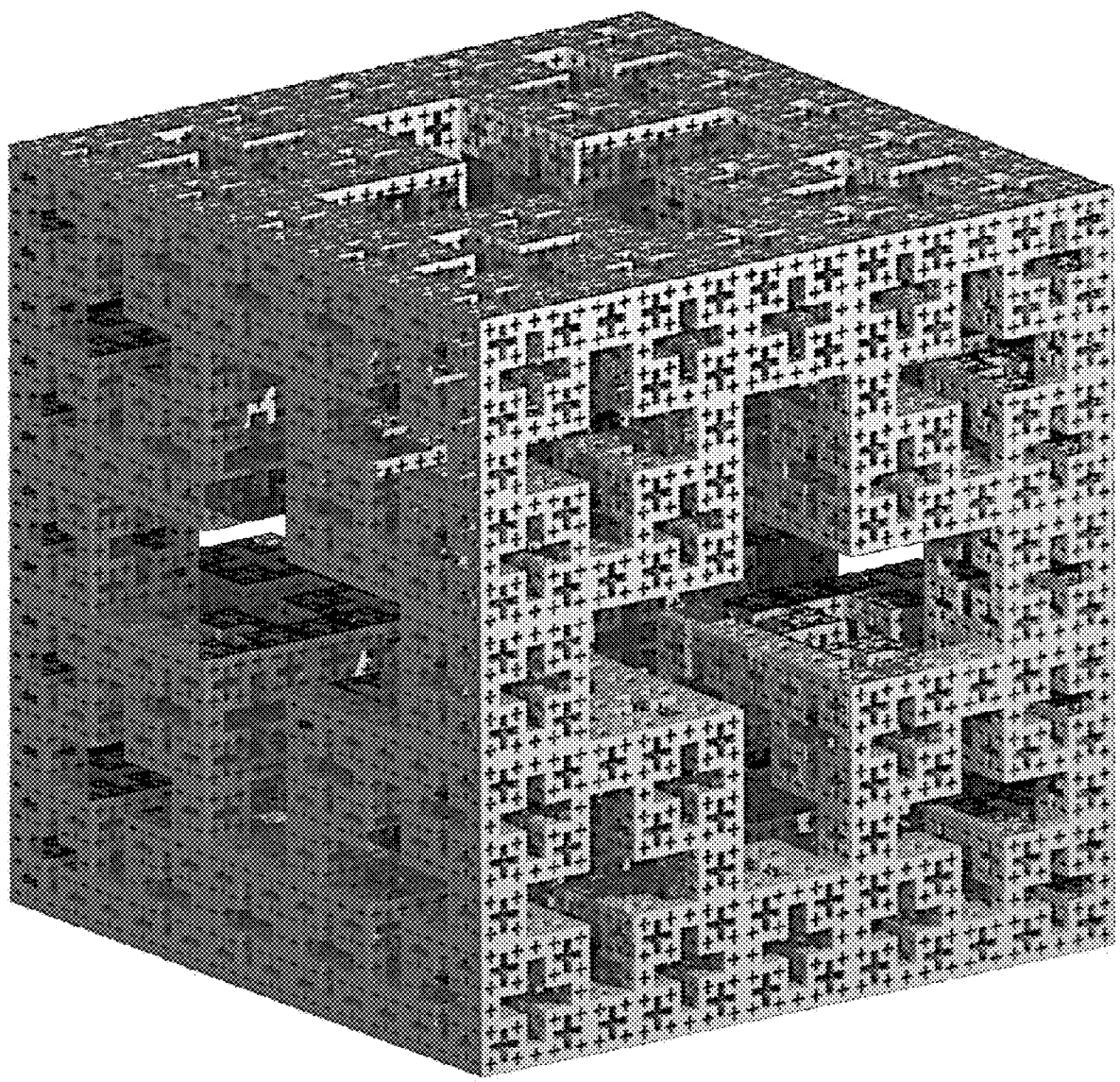
FIG. 16 illustrates a fractal heatsink that is an exemplary embodiment of the invention. In this embodiment, the heatsink is based on a Jerusalem cube.

In accordance with another embodiment, the heatsink may comprise a heat exchange device which is structurally configured based on a Jerusalem cube, as exemplarily illustrated in FIG. 16. The Jerusalem cube may be obtained by recursively drilling Greek cross-shaped holes into a cube. The Jerusalem Cube may be constructed as follows:
1. Start with a cube.
2. Cut a cross through each side of the cube, leaving eight cubes (of rank+1) at the corners of the original cube, as well as twelve smaller cubes (of rank+2) centered on the edges of the original cube between cubes of rank+1.
3. Repeat the process on the cubes of rank 1 and 2.

Each iteration adds eight cubes of rank one and twelve cubes of rank two, a twenty-fold increase.

Figure 17:
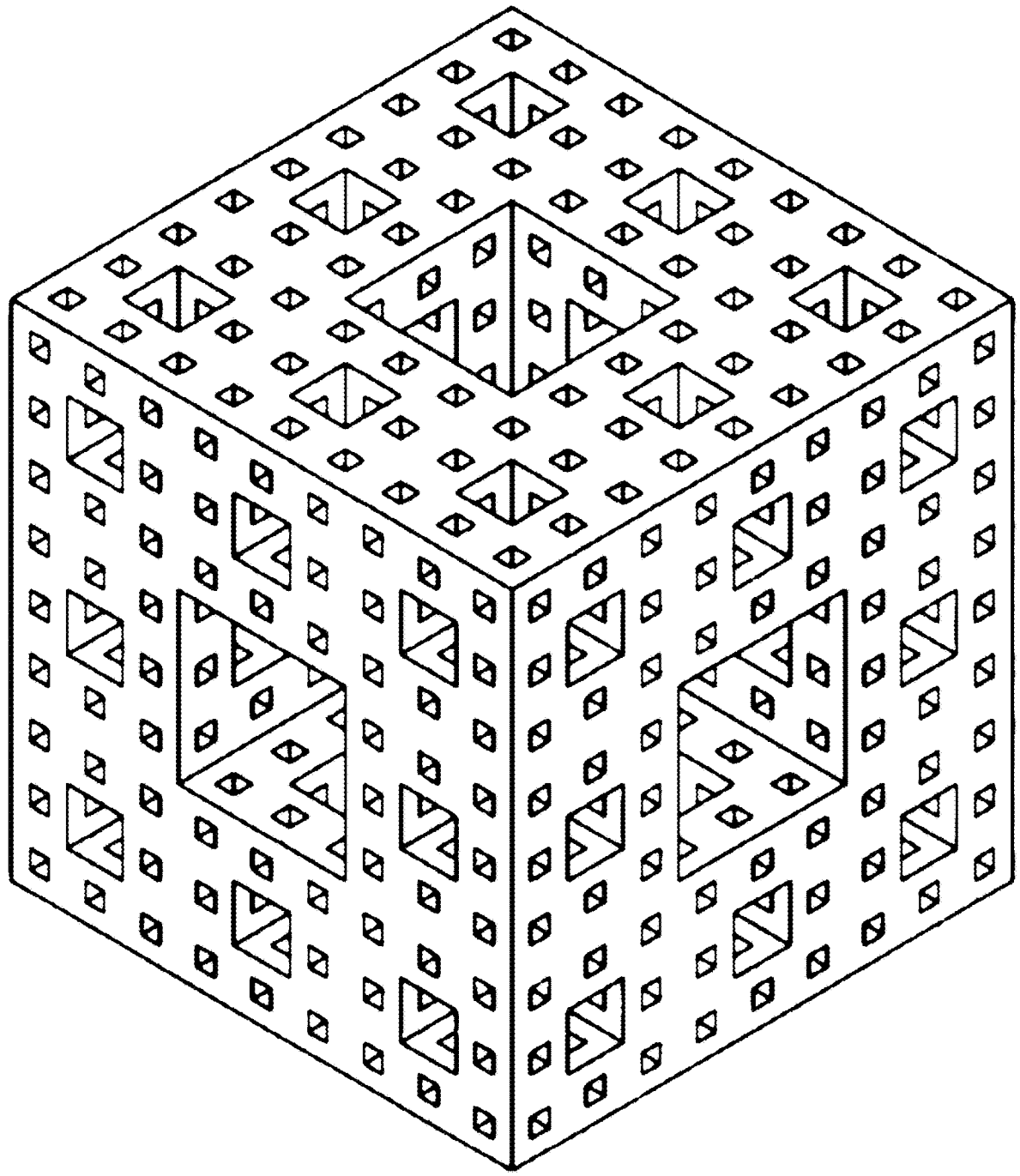
FIG. 17 illustrates a fractal heatsink that is an exemplary embodiment of the invention. In this embodiment, the heatsink is based on a Menger sponge.

In accordance with another embodiment, the heatsink may comprise a heat exchange device which is structurally configured based on a Menger sponge, as exemplarily illustrated in FIG. 17. The Menger sponge may be constructed as follows:
1. Begin with a cube (first image).
2. Divide every face of the cube into 9 squares, like a Rubik's Cube. This will sub-divide the cube into 27 smaller cubes.
3. Remove the smaller cube in the middle of each face, and remove the smaller cube in the very center of the larger cube, leaving 20 smaller cubes (second image). This is a level-1 Menger sponge (resembling a Void Cube).
4. Repeat steps 2 and 3 for each of the remaining smaller cubes, and continue to iterate ad infinitum.

Figure 18:
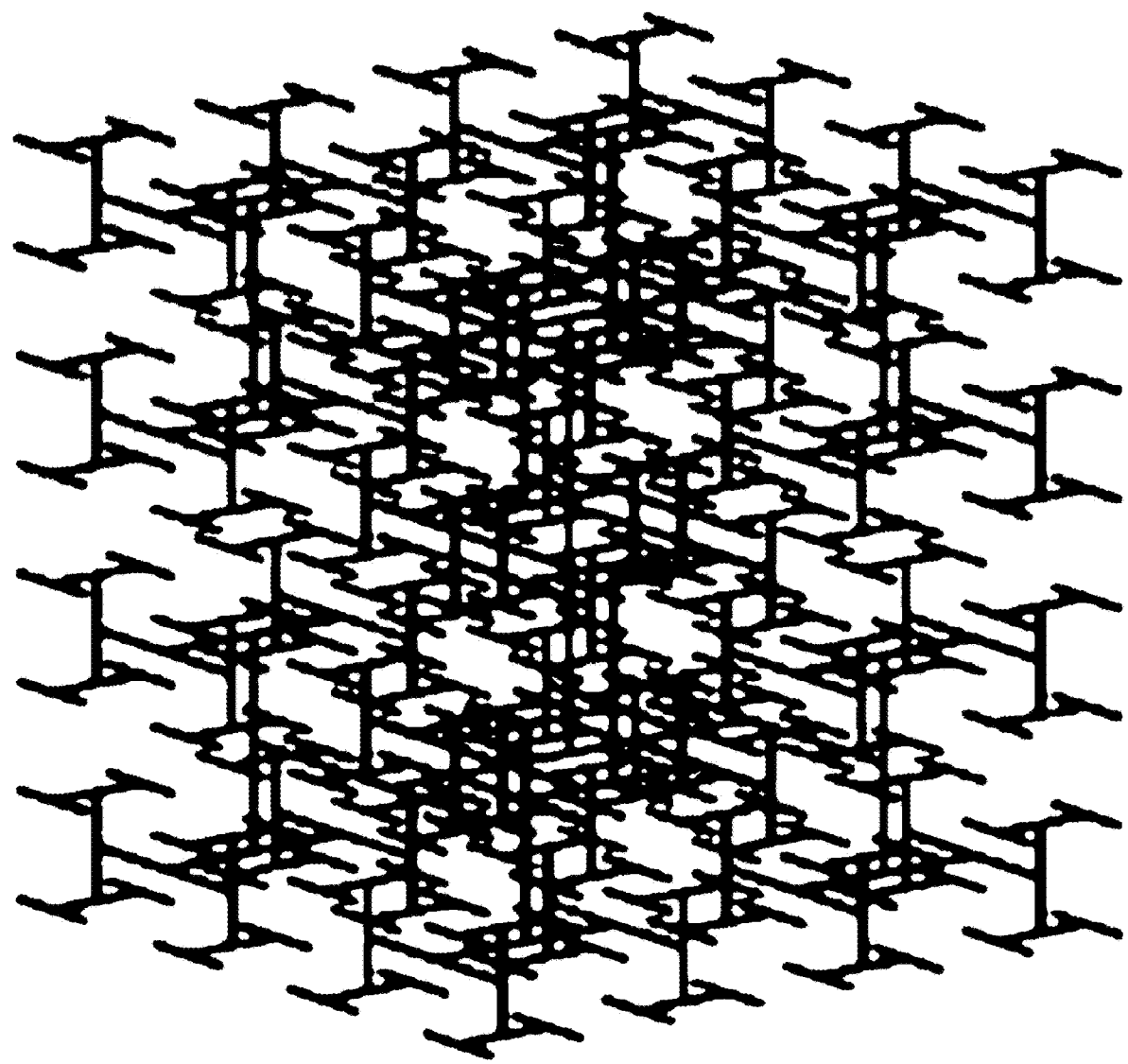
FIG. 18 illustrates a fractal heatsink that is an exemplary embodiment of the invention. In this embodiment, the heatsink is based on a 3D H fractal.

In accordance with another embodiment, the heatsink may comprise a heat exchange device which is structurally configured based on a 3D H fractal, as exemplarily illustrated in FIG. 18. The 3D H fractal is based on an H-tree which may be constructed by starting with a line segment of arbitrary length, drawing two shorter segments at right angles to the first through its endpoints, and continuing in the same vein, reducing (dividing) the length of the line segments drawn at each stage by $\sqrt{2}$. Further, by adding line segments on the direction perpendicular to the H tree plane, the 3D H fractal may be obtained.

Figure 19:
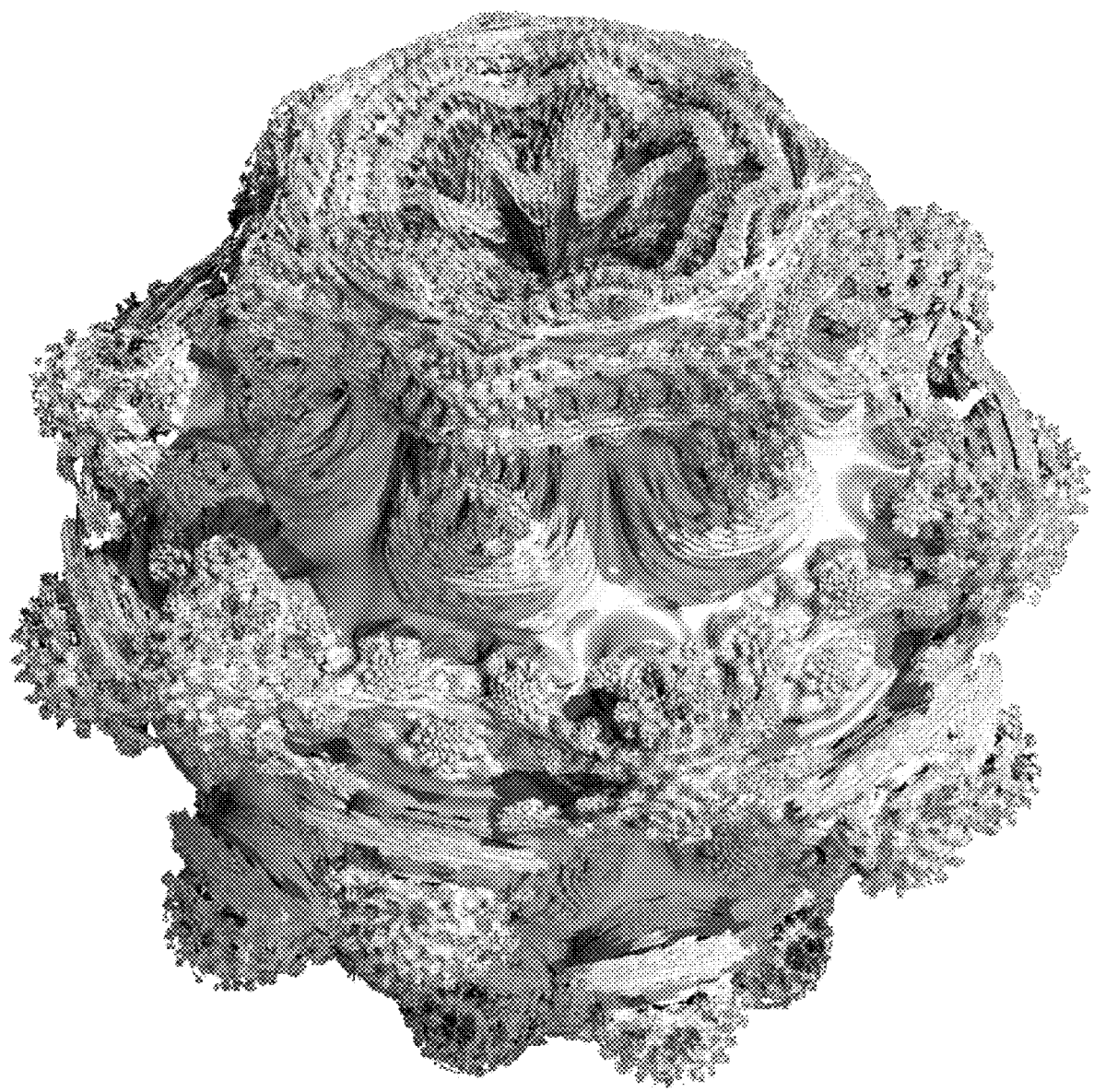
FIG. 19 illustrates a fractal heatsink that is an exemplary embodiment of the invention. In this embodiment, the heatsink is based on a Mandelbulb.

In accordance with another embodiment, the heatsink may comprise a heat exchange device which is structurally configured based on a Mandelbulb, as exemplarily illustrated in FIG. 19. The Mandelbulb is a three-dimensional analogue of the Mandelbrot set. The Mandelbulb may be defined as the set of those C in $\mathbb{R}^3$ for which the orbit of <0, 0, 0> under the iteration $v \mapsto v^n + c$ is bounded, where the "nth power" of the vector $v = \langle x, y, z \rangle$ in $\mathbb{R}^3$ is given by eq. 17.

$$v^n := r^n \langle \sin(n\theta)\cos(n\phi), \sin(n\theta)\sin(n\phi), \cos(n\theta) \rangle \quad (17)$$

Where
$r = \sqrt{x^2 + y^2 + z^2}$,
$\phi = \arctan(y/x) = \arg(x+yi)$, and
$\theta = \arctan(\sqrt{x^2+y^2}/z) = \arccos(z/r)$.

In accordance with another embodiment of the invention disclosed herein, the heatsink comprises a heat exchange device having a plurality of heat exchange elements which are perforated. As a result, an enhanced heat transfer may be achieved. Additionally, use of perforations may increase heat transfer by up to a factor of two per pumping power. Further, in a specific embodiment, the plurality of heat exchange elements may be hollow. The combination of hollow heat exchange elements with perforations can result in increases in heat transfer greater than that of a solid heat exchange element of the same diameter. Additionally, increases in heat transfer per pumping power of up to 20% could be achieved by varying the inclination angle and diameter of the perforations in aligned arrays of the plurality of heat exchange elements. Furthermore, one or more of the number of perforations and shape of perforations may be configured in order to control the heat transfer. For instance, under natural convection, heat transfer is directly proportional to the number of square perforations. In another instance, circular and square perforations may be used to obtain higher Nusselt number. Since heat transfer is proportional to Nusselt number, greater heat transfer may be achieved with such an arrangement. In yet another instance, the Nusselt number corresponding to the plurality of heat exchange elements may be varied based on one or more of a pitch, a hole diameter, a surface area and flow velocity. In particular, by modifying the pitch of the perforations, the Nusselt number and hence heat transfer may be increased.

In an embodiment, the heat transfer effectiveness of the plurality of heat exchange elements may be greater than or equal to a minimum value such that addition of the plurality of heat exchange elements is justified. As a non limiting example, the minimum value may be ten.

In another embodiment, a spacing between the plurality of heat exchange elements is determined based on a height of the plurality of heat exchange elements. In a specific embodiment, for a given heat rate, an optimal spacing between the plurality of heat exchange elements may decrease with an increase in height of the plurality of heat exchange elements.

In yet another embodiment, a shape corresponding to the plurality of heat exchange elements may be configured to provide enhanced heat transfer. For instance, the plurality of heat exchange elements may be fluted. As a result, an increase in heat transfer by up to 9% may be achieved. In another instance, the plurality of heat exchange elements may be wavy providing an increase in heat transfer by up to 6%. In one embodiment, the shape corresponding to the plurality of heat exchange elements may be triangular, circular, elliptical, rectangular and trapezoidal. For instance, the plurality of heat exchange elements may be elliptically annular. Further, an elliptical aspect ratio corresponding to the plurality of heat exchange elements may be varied in order to obtain greater heat transfer efficiency. As a non-limiting example, the elliptical aspect ratio may be increased in order to obtain higher heat transfer efficiency. In another instance, the plurality of heat exchange elements may be trapezoidal with an optimal aspect number of 1.5. In yet another instance, the plurality of heat exchange elements may be diamond shaped pin fins. Further, the pitch corresponding to the plurality of heat exchange elements may be varied to obtain enhanced heat transfer. For example, the pitch may be varied in proportion to the required heat transfer coefficient. As a result, increase in heat transfer up to 340% beyond that of flat pin fins may be achieved.

In other embodiments of the invention, the surface geometry of the plurality of heat exchange elements may be varied in order to provide enhanced heat transfer. For instance, square ribs along the plurality of heat exchange elements may used. As a result, thermal performance may increase by up to 30%. In another instance, diamond shaped surface protrusions may be provided over the plurality of heat exchange elements. Consequently, thermal performance may be increased by up to 38% while also leading to better flow distribution. In yet another instance, grooves may be created on the surfaces of the plurality of heat exchange elements. As a result, heat transfer could increase by up to 25%. In a further instance, dimples may be placed on the flat base of the plurality of heat exchange elements forming a pin fin. Consequently, an increase in heat transfer by up to 8% may be achieved while also reducing the friction factor by up to 18%. Further, in an instance, convex shaped dimples may be used to obtain greater heat transfer.

In some other embodiments, an orientation of the plurality of heat exchange elements may be varied in order to enhance heat transfer. For instance, in case the number of the plurality of heat exchange elements is large, the plurality of heat exchange elements may be oriented vertically with respect to the flat base of the plurality of heat exchange elements. In another instance, in case the plurality of heat exchange elements are short with a finning factor of less than 2.7, a horizontal orientation may be used in order to provide better heat transfer.

In other embodiments, the plurality of heat exchange elements may be configured in order to control an amount of heat transfer by radiation. For example, the height of the plurality of heat exchange elements may be maintained short. As a result, up to 55% of the heat transfer may take place by radiation. On the other hand, the height of the plurality of heat exchange elements may be increased in order to reduce the amount of heat transfer by radiation. As another example, the plurality of heat exchange elements may be circular around an annular heat pipe. Further, a ratio of spacing between the plurality of heat exchange elements and diameter of the plurality of heat exchange elements may be controlled in order to vary the amount of heat transfer by radiation. For instance, the ratio may be decreased in order to decrease the amount of heat transfer by radiation. Similarly, the ratio may be increased in order to increase the amount of heat transfer by radiation.

In an embodiment, the number of iterations corresponding to the fractal variation between respective branches of the plurality of heat exchange elements may be configured in order to control heat transfer. For instance, the number of iterations may be increased in order to obtain greater heat transfer. However, beyond a certain limit, heat transfer may not be directly proportional to the number of iterations. Additionally, varying the number of iterations may also control diffusion rate across the surfaces of the plurality of heat exchange elements based on the fact that diffusion rate is directly proportional to the number of iterations. However, a certain number of iterations such as, but not limited to, four to five iterations, the diffusion rate may converge.

In another embodiment, a dimension corresponding to the fractal variation between respective branches of the plurality of heat exchange elements may be configured in order to control heat transfer. In general, the heat transfer is directly proportional to the fractal dimension.

However, this relationship is valid only till a limited number of iterations.

In yet another embodiment, the number of branches corresponding to the plurality of heat exchange elements may be configured to control the heat transfer. Under natural convection, heat transfer effectiveness is found to be directly proportional to the number of branches. However, after a certain number of branch generations, heat transfer effectiveness saturates. Further, a branching ratio may be configured in order to obtain minimum resistance to heat conduction and hence greater heat transfer. In a non-limiting example, a branching ratio of 0.707 or 0.7937 may be used.

In another embodiment, heat transfer may be controlled based on the velocity of fluidic heat exchange medium flowing over the plurality of heat exchange elements. In general, the heat transfer under forced convection is directly proportional to the velocity of fluidic heat exchange medium. Additionally, the optimal number of branches required to maximize heat transfer is reduced with increase in velocity of fluidic heat exchange medium. Accordingly, under forced convection with higher velocity, a fewer number of branches may be required to achieve a required amount of heat transfer. In another embodiment, heat transfer by the plurality of heat exchange elements in the form of an array of perforated fins may be controlled by varying a pumping power. In this case, the heat transfer can be inversely proportional to the pumping power with small increase for turbulent cross-flow but significant increase for parallel flow.

In accordance with embodiments disclosed herein, the heat sink may be manufactured using manufacturing techniques such as, but not limited to, injection molding, die casting, extrusion, forging, gravitational molding, CNC milling, CNC punching, stamping, wire cut machine and wire cut Electrical Discharge Machining (EDM), additive manufacturing (e.g., 3D printing, 2.5D printing, etc.

In a particular embodiment, the heatsink may be manufactured by a machining processing employing cutting tools and controlled slicing techniques to construct the plurality of heat exchange elements from a solid block of material such as, but not limited to, copper or aluminum. This technique is preferable to construct the plurality of heat exchange elements with smaller thickness than is possible by other techniques such as extrusion. Advantages of the heatsink manufactured using this technique include high aspect ratio, thin fin, low tooling cost, easy and inexpensive to prototype, unidirectional flow and single piece construction.

In another embodiment, the heatsink may be manufactured by bending sheets made of, but not limited to, copper or aluminum into fins to form the plurality of heat exchange elements. The fins are then bonded to the flat base of the heatsink. This technique allows the flat base and the fins to be made of different materials. Advantages of this manufacturing technique include light weight of fins, lower tooling cost and differing materials for the flat base and the fins. In yet another embodiment, the heatsink may be manufactured from sheets of material such as, but not limited to, copper or aluminum bonded onto the flat base using one or more of epoxy, soldering and brazing. This technique of manufacturing is suitable for high power application with low thermal resistance and where forced air cooling is available.

In a further embodiment, the heatsink may be manufactured using die casting. In this technique, material such as, but not limited to, liquid aluminum is forced under high pressure into re-usable steel molds. This technique is specially suited when the plurality of heat exchange elements are of complex shapes.

Those skilled in the art will recognize many ways to fabricate the heatsinks described herein. For example, modern three-dimensional laser and liquid printers can create objects such as the heatsinks described herein with a resolution of features on the order of 16 µm. Also, it is possible to grow a crystal structure using a recursive growth algorithm or through crystal growth techniques. For example, US Patent Application No. 2006/0037177, expressly incorporated herein by reference, describes a method of controlling crystal growth to produce fractals or other structures through the use of spectral energy patterns by adjusting the temperature, pressure, and electromagnetic energy to which the crystal is exposed. This method might be used to fabricate the heatsinks described herein. For larger heatsinks, such as those intended to be used in car radiators, traditional manufacturing methods for large equipment can be adapted to create the fractal structures described herein.

This document describes in detail illustrative examples of the inventive apparatus, methods, and articles of manufacture for making fractal heatsinks. Neither the specific embodiments of the invention as a whole, nor those of its features necessarily limit the general principles underlying the invention. The specific features described herein may be used in some embodiments, but not in others, in the various combinations and permutations, without departure from the spirit and scope of the invention as set forth herein. Various physical arrangements of components and various step sequences also fall within the intended scope of the invention. Many additional modifications are intended in the foregoing disclosure, and it will be appreciated by those of ordinary skill in the art that in some instances some features of the invention will be employed in the absence of a corresponding use of other features. The illustrative examples therefore do not limit the metes and bounds of the invention and the legal protection afforded the invention, which function is carried out by current and future claims and their equivalents.

What is claimed is:

1. A heatsink configured to transfer heat from a heat source to a surrounding heat exchange medium, comprising:
   an interface, configured to receive heat into a heat transmissive body from the heat source;
   the heat transmissive body receiving heat from the interface;
   the surrounding heat exchange medium; and
   a plurality of non-uniform heatsink surfaces extending from the heat transmissive body into the surrounding heat exchange medium, each of the plurality of non-uniform heatsink surfaces having localized geometric features having a branched fractal geometry relationship with self-similar features having differences in scale across the plurality of non-uniform heatsink surfaces defined by manufactured localized geometric features corresponding to at least three iterations of a fractal generative algorithm, configured to:
interact with a forced flow of the surrounding heat exchange medium to create distinct regions of separated flow of the surrounding heat exchange medium; and
generate self-sustaining oscillations of the surrounding heat exchange medium over a range of acoustic frequencies of the surrounding heat exchange medium dependent on the forced flow.

2. The heatsink according to claim 1, further comprising a pump or fan configured to induce the forced flow of the surrounding heat exchange medium, wherein the self-sustaining oscillations vary in characteristic frequency among the respective non-uniform heatsink surfaces.

3. The heatsink according to claim 1, wherein the self-sustaining oscillations of the surrounding heat exchange medium around the plurality of non-uniform heatsink surfaces occur over a range of frequencies extend across an acoustic band and substantially reduce narrow band acoustic resonance as compared to self-sustaining oscillations of the surrounding heat exchange medium around a corresponding plurality of uniform heatsink surfaces.

4. The heatsink according to claim 1, wherein the localized geometric features comprise concave regions or cavities.

5. The heatsink according to claim 1, wherein the fractal geometry relationship is defined by manufactured localized geometric features comprising a non-planar structure defined by a volumetric fractal generative algorithm.

6. The heatsink according to claim 1, wherein the plurality of non-uniform heatsink surfaces are configured to generate an asymmetric pattern of vortices over a range of fluid forced flow rates of the surrounding heat exchange medium.

7. The heatsink according to claim 1, wherein the plurality of non-uniform heatsink surfaces comprise textured surfaces.

8. The heatsink according to claim 1, wherein the plurality of non-uniform heatsink surfaces have a physical configuration that varies over time.

9. The heatsink according to claim 1, wherein the forced flow of the surrounding heat exchange medium over the plurality of non-uniform heatsink surfaces at a flow rate comprises a turbulent flow which disturbs a stagnant surface boundary layer of the surrounding heat exchange medium on the plurality of non-uniform heatsink surfaces of respective heat exchange elements, increasing efficiency of heat transfer with respect to a laminar flow of the surrounding heat exchange medium over the plurality of non-uniform heatsink surfaces at the flow rate.

10. The heatsink according to claim 1, wherein the plurality of non-uniform heatsink surfaces have at least one geometric characteristic that varies among the plurality of non-uniform heatsink surfaces according to a fractal of order at least three corresponding to the at least three iterations of the fractal generative algorithm, such that for a given flow rate of the surrounding heat exchange medium, a first portion of the forced flow is laminar and a second portion of the forced flow is turbulent at corresponding portions of the plurality of non-uniform heatsink surfaces, wherein the first portion and the second portion vary dependent on the given flow rate.

11. The heatsink according to claim 1, wherein the plurality of heat exchange elements are together configured as at least one of a Mandelbox, a Sierpinski tetrahedron, a dodecahedron fractal, an icosahedron flake, an octahedron flake, 3D Quadratic Koch fractal, Jerusalem cube, a von Koch surface, a Menger sponge, a 3D H-fractal, and a Mandelbulb.

12. The heatsink according to claim 11,
wherein the plurality of heat exchange elements comprise textured surfaces, and
wherein the forced flow of the surrounding heat exchange medium over the textured surfaces of the plurality of heat exchange elements disturbs a stagnant surface boundary layer of the surrounding heat exchange medium, increasing heat transfer efficiency with respect to laminar forced flow of the surrounding heat exchange medium over the plurality of heat exchange elements.

13. The heatsink according to claim 11, wherein each non-uniform heatsink surface has respective non-uniform localized geometric features further configured to selectively couple the generated self-sustaining oscillations of the surrounding heat exchange medium proximate to a respective heat exchange element to a subset of the other heat exchange elements.

14. A heatsink configured to transfer heat from a heat source to a surrounding heat exchange medium, comprising:
an interface, configured to receive heat from the heat source into a heat transmissive body from the heat source;
the heat transmissive body being configured to conduct heat from the interface; and
a plurality of heat exchange elements, each having respective geometric features having different sizes and different locations defined by a recursive relationship, extending from the heat transmissive body into the surrounding heat exchange medium, configured to transfer the conducted heat to the surrounding heat exchange medium;
wherein each heat exchange element has respective geometric features defined by the recursive relationship, configured to:
interact with the forced flow in the surrounding heat exchange medium to create pockets of separated flow of the surrounding heat exchange medium, and
generate self-sustaining oscillations of the forced flow of the surrounding heat exchange medium from the pockets of separated flow over a range of different resonant acoustic frequencies associated with the different sizes and different locations.

15. The heatsink according to claim 14, wherein the plurality of heat exchange elements have a physical configuration that is automatically thermally responsive.

16. The heatsink according to claim 14, wherein the geometric features have a fractal geometry relationship across the plurality of heat exchange elements and comprise concave regions.

17. The heatsink according to claim 14, further comprising pump or fan configured to induce the forced flow of the surrounding heat exchange medium over the plurality of heat exchange elements.

18. A heatsink configured to transfer heat from a heat source to a surrounding heat exchange medium, comprising:
an interface, configured to receive heat into a heat transmissive body from the heat source, the heat transmissive body receiving heat from the interface;
the surrounding heat exchange medium; and
a plurality of branched non-uniform heatsink surfaces, having a range of different dimensions, extending from the heat transmissive body into the surrounding heat exchange medium, and having non-uniform localized geometric features;

the plurality of branched non-uniform heatsink surfaces being configured to interact with a forced flow of the surrounding heat exchange medium to create distinct regions of separated flow of the surrounding heat exchange medium, and to generate self-sustaining oscillations of the surrounding heat exchange medium over a range of acoustic frequencies dependent on the forced flow of the surrounding heat exchange medium and the non-uniform localized geometric features, wherein the non-uniform localized geometric features of the plurality of branched non-uniform heatsink surfaces comprise manufactured non-uniform localized geometric features have a fractal geometry relationship defined by at least three iterations of a fractal generative algorithm.

* * * * *